US009363071B2

(12) United States Patent
Sengoku et al.

(10) Patent No.: US 9,363,071 B2
(45) Date of Patent: Jun. 7, 2016

(54) CIRCUIT TO RECOVER A CLOCK SIGNAL FROM MULTIPLE WIRE DATA SIGNALS THAT CHANGES STATE EVERY STATE CYCLE AND IS IMMUNE TO DATA INTER-LANE SKEW AS WELL AS DATA STATE TRANSITION GLITCHES

(71) Applicant: QUALCOMM Incorporated, San Diego, CA (US)

(72) Inventors: Shoichiro Sengoku, San Diego, CA (US); Chulkyu Lee, San Diego, CA (US); George Alan Wiley, San Diego, CA (US); Joseph Cheung, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 14/199,322

(22) Filed: Mar. 6, 2014

(65) Prior Publication Data
US 2014/0254733 A1    Sep. 11, 2014

Related U.S. Application Data

(60) Provisional application No. 61/774,247, filed on Mar. 7, 2013, provisional application No. 61/774,408, filed on Mar. 7, 2013, provisional application No. 61/778,768, filed on Mar. 13, 2013.

(51) Int. Cl.
*H04B 3/00* (2006.01)
*H04L 7/033* (2006.01)
*H04L 7/027* (2006.01)
(Continued)

(52) U.S. Cl.
CPC .............. *H04L 7/033* (2013.01); *H03K 5/1252* (2013.01); *H03K 5/1534* (2013.01); *H04L 7/0066* (2013.01); *H04L 7/027* (2013.01); *H04L 25/14* (2013.01); *H04L 25/49* (2013.01); *H04L 25/493* (2013.01); *H04L 25/4906* (2013.01); *H04L 25/0272* (2013.01)

(58) Field of Classification Search
None
See application file for complete search history.

(56) References Cited

U.S. PATENT DOCUMENTS 4,280,221 A    7/1981  Chun et al.
4,644,547 A    2/1987  Vercellotti et al.
(Continued)

FOREIGN PATENT DOCUMENTS

DE          3329773 A1    2/1985
DE    102004013093 B3    7/2005
(Continued)

OTHER PUBLICATIONS

Bell A G., et al., "WAM 7.1: A Single Chip NMOS Ethernet Controller", IEEE: International Solid-State Circuits Conference, XX, XX, Feb. 23, 1983, XP001 039599, pp. 13-78.
International Search Report and Written Opinion—PCT/US2014/021958—ISA/EPO—Jun. 13, 2014.
Muller P., et al., "Top-Down Design of a Low-Power Multi-Channel 2.5-Gbit/s/Channel Gated Oscillator Clock-Recovery Circuit", Design, Automation and Test in Europe, 2005. Proceedings Munich, Germany Mar. 7-11, 2005, Piscataway, NJ, USA, IEEE, Mar. 7, 2005, pp. 258-263, XP010779962, ISBN: 978-0-7695-2288-3.
(Continued)

*Primary Examiner* — Adolf Dsouza
(74) *Attorney, Agent, or Firm* — Loza & Loza, LLP

(57) ABSTRACT

A clock recovery circuit is provided comprising a receiver circuit and a clock extraction circuit. The receiver circuit may be adapted to decode a differentially encoded signal on a plurality of data lines, where at least one data symbol is differentially encoded in state transitions of the differentially encoded signal. The clock extraction circuit may be adapted to obtain a clock signal from state transition signals derived from the state transitions.

24 Claims, 17 Drawing Sheets

(51) Int. Cl.

| | |
|---|---|
| H04L 7/00 | (2006.01) |
| H04L 25/49 | (2006.01) |
| H04L 25/493 | (2006.01) |
| H03K 5/1252 | (2006.01) |
| H03K 5/1534 | (2006.01) |
| H04L 25/14 | (2006.01) |
| H04L 25/02 | (2006.01) |

(56) References Cited

U.S. PATENT DOCUMENTS

| | | | |
|---|---|---|---|
| 4,839,907 A | 6/1989 | Saneski | |
| 5,493,538 A | 2/1996 | Bergman | |
| 5,703,914 A | 12/1997 | Nakamura | |
| 5,862,180 A * | 1/1999 | Heinz | 375/244 |
| 5,959,568 A | 9/1999 | Woolley | |
| 6,320,406 B1 | 11/2001 | Morgan et al. | |
| 6,320,437 B1 | 11/2001 | Ma | |
| 6,526,112 B1 | 2/2003 | Lai | |
| 6,556,628 B1 | 4/2003 | Poulton et al. | |
| 6,624,766 B1 | 9/2003 | Possley et al. | |
| 6,728,908 B1 | 4/2004 | Fukuhara et al. | |
| 6,836,522 B1 | 12/2004 | Wakayama | |
| 6,874,097 B1 | 3/2005 | Aliahmad et al. | |
| 6,933,866 B1 | 8/2005 | Weitz | |
| 7,061,939 B1 | 6/2006 | Chengson et al. | |
| 7,076,377 B2 | 7/2006 | Kim et al. | |
| 7,167,527 B1 | 1/2007 | Park et al. | |
| 7,190,754 B1 | 3/2007 | Chang et al. | |
| 7,339,502 B2 | 3/2008 | Furtner | |
| 7,358,869 B1 | 4/2008 | Chiarulli et al. | |
| 7,395,347 B2 | 7/2008 | Nemawarkar et al. | |
| 7,463,680 B2 | 12/2008 | Buckwalter et al. | |
| 7,502,953 B2 | 3/2009 | Boecker et al. | |
| 7,667,500 B1 | 2/2010 | Alfke | |
| 7,715,509 B2 | 5/2010 | Stojanovic et al. | |
| 7,741,876 B2 | 6/2010 | Fusayasu et al. | |
| 7,781,677 B2 | 8/2010 | Matsubara et al. | |
| 7,983,347 B2 | 7/2011 | Hamada et al. | |
| 8,000,412 B1 | 8/2011 | Loinaz | |
| 8,159,376 B2 | 4/2012 | Abbasfar | |
| 8,184,760 B2 | 5/2012 | Chien et al. | |
| 8,264,253 B2 | 9/2012 | Tian et al. | |
| 8,284,848 B2 | 10/2012 | Nam et al. | |
| 8,446,903 B1 | 5/2013 | Ranganathan et al. | |
| 8,621,128 B2 | 12/2013 | Radulescu et al. | |
| 8,659,957 B2 | 2/2014 | Sekine | |
| 8,686,754 B2 | 4/2014 | Chopra et al. | |
| 8,848,810 B2 | 9/2014 | Lee et al. | |
| 9,071,220 B2 | 6/2015 | Sengoku et al. | |
| 9,178,690 B2 | 11/2015 | Sengoku | |
| 9,203,599 B2 | 12/2015 | Sengoku | |
| 2004/0203559 A1 | 10/2004 | Stojanovic et al. | |
| 2005/0053171 A1 | 3/2005 | Pickering et al. | |
| 2005/0069071 A1 | 3/2005 | Kim et al. | |
| 2005/0104649 A1 | 5/2005 | Yonezawa | |
| 2005/0140415 A1 | 6/2005 | Hazucha et al. | |
| 2005/0218953 A1 | 10/2005 | Slawecki | |
| 2006/0006902 A1 | 1/2006 | Sagiv | |
| 2006/0061494 A1 | 3/2006 | Hosaka et al. | |
| 2006/0132335 A1 | 6/2006 | Kojima | |
| 2007/0073932 A1 | 3/2007 | Pike et al. | |
| 2007/0188187 A1 | 8/2007 | Oliva et al. | |
| 2007/0241836 A1 | 10/2007 | Miller | |
| 2008/0063127 A1 | 3/2008 | Hayashi et al. | |
| 2008/0159432 A1 | 7/2008 | Ng | |
| 2008/0165732 A1 | 7/2008 | Kim et al. | |
| 2008/0212709 A1 * | 9/2008 | Wiley | 375/286 |
| 2009/0080584 A1 | 3/2009 | Hamano et al. | |
| 2009/0195699 A1 | 8/2009 | Hamada et al. | |
| 2009/0243681 A1 | 10/2009 | Zerbe et al. | |
| 2010/0001758 A1 | 1/2010 | Dreps et al. | |
| 2010/0002819 A1 | 1/2010 | Conner | |
| 2010/0027607 A1 | 2/2010 | Kwasniewski et al. | |
| 2010/0040169 A1 | 2/2010 | Abbasfar | |
| 2010/0111207 A1 | 5/2010 | Suda et al. | |
| 2010/0180143 A1 | 7/2010 | Ware et al. | |
| 2010/0215118 A1 | 8/2010 | Ware et al. | |
| 2010/0264967 A1 | 10/2010 | Lee et al. | |
| 2011/0013707 A1 | 1/2011 | Walker et al. | |
| 2011/0176646 A1 * | 7/2011 | Pal et al. | 375/354 |
| 2011/0197086 A1 | 8/2011 | Rivoir | |
| 2011/0216863 A1 | 9/2011 | Tomita et al. | |
| 2011/0249781 A1 | 10/2011 | Guillot et al. | |
| 2012/0020660 A1 * | 1/2012 | Le Taillandier De Gabory et al. | 398/25 |
| 2012/0213299 A1 | 8/2012 | Cronie et al. | |
| 2012/0223754 A1 | 9/2012 | Lewis | |
| 2012/0224656 A1 | 9/2012 | Aoki | |
| 2013/0225067 A1 | 8/2013 | Card et al. | |
| 2013/0241759 A1 | 9/2013 | Wiley et al. | |
| 2013/0279551 A1 | 10/2013 | Fujimori et al. | |
| 2013/0294490 A1 | 11/2013 | Chandrasekaran et al. | |
| 2014/0009633 A1 | 1/2014 | Chopra et al. | |
| 2014/0254732 A1 | 9/2014 | Sengoku et al. | |
| 2014/0270026 A1 | 9/2014 | Sengoku et al. | |
| 2014/0286389 A1 | 9/2014 | Zerbe et al. | |
| 2014/0286466 A1 | 9/2014 | Sengoku et al. | |
| 2014/0348214 A1 | 11/2014 | Sengoku et al. | |
| 2015/0043358 A1 | 2/2015 | Wiley et al. | |
| 2015/0098536 A1 | 4/2015 | Sengoku | |
| 2015/0098537 A1 | 4/2015 | Sengoku | |
| 2015/0098538 A1 | 4/2015 | Wiley et al. | |
| 2015/0220472 A1 | 8/2015 | Sengoku | |
| 2015/0295701 A1 | 10/2015 | Sengoku | |
| 2016/0028534 A1 | 1/2016 | Sengoku | |
| 2016/0065357 A1 | 3/2016 | Sengoku | |

FOREIGN PATENT DOCUMENTS

| | | |
|---|---|---|
| EP | 1385306 A1 | 1/2004 |
| GB | 2456517 A | 7/2009 |
| JP | 2008242884 A | 10/2008 |
| WO | WO-2007009038 A2 | 1/2007 |
| WO | WO-2008109478 A2 | 9/2008 |
| WO | WO-2008151251 A1 | 12/2008 |
| WO | WO-2009086078 A1 | 7/2009 |
| WO | WO-2009111175 A1 | 9/2009 |

OTHER PUBLICATIONS

VITESSE, "VSC7226 Quad 3.125Gb/s Backplane Transceiver," VITESSE Semiconductor Corporation, PB-VSC7226-002, 2002, 2 Pages.

"Draft MIPI Alliance Specification for Camera Serial Interface 2 (CSI-2)" In:"Draft MIPI Alliance Specification for Camera Serial Interface 2 (CSI-2)", Apr. 2, 2009, XP055165978, 6. Camera Control Interface (CCI) 529-728.

"MIPI Alliance Specification for D-PHY," Sep. 22, 2009, pp. 1-125, XP055057664 [Retrieved on Mar. 25, 2013].

Poulton J W., et al., "Multiwire Differential Signaling", Aug. 6, 2003 No. 1.1, pp. 1-20, XP002610849, Retrieved from the Internet: URL:http://www.cs.unc.eduf-jpfmwire.pdf [retrieved on Nov. 23, 2010] the whole document.

Williams A., "Synopsys describes MIPI DigRF protocol for 4G mobile," Retrieved from the Internet <URL: http://www.electronicsweekly.com/news/design/eda-and-ip/synopsys-describes-mipi-digrf-protocol-for-4g-mobile-2012-03/ >, 2012, 6 Pages.

Zhu C., et al., "Multi-Machine Communication Based on I2C-Bus," Sensors & Transducers, Jul. 2014, vol. 174 (7), pp. 138-143.

Zogopoulos S., et al., "High-Speed Single-Ended Parallel Link Based on Three-Level Differential Encoding", IEEE Journal of Solid-State Circuits, IEEE Service Center, Piscataway, NJ, USA, vol. 44, No. 2, Feb. 1, 2009, pp. 549-557, XP011243176, ISSN: 0018-9200, DOI: 10.1109/JSSC.2008.2011038 the whole document.

* cited by examiner

CIRCUIT TO RECOVER A CLOCK SIGNAL FROM MULTIPLE WIRE DATA SIGNALS THAT CHANGES STATE EVERY STATE CYCLE AND IS IMMUNE TO DATA INTER-LANE SKEW AS WELL AS DATA STATE TRANSITION GLITCHES

CLAIM OF PRIORITY UNDER 35 U.S.C. §119

The present Application for Patent claims priority to:

U.S. Provisional Application No. 61/774,247 entitled "Circuit To Recover A Clock Signal From Multiple Wire Data Signals That Changes State Every State Cycle And Is Immune To Data Inter-Lane Skew As Well As Data State Transition Glitches", filed Mar. 7, 2013, U.S. Provisional Application No. 61/774,408 entitled "Transcoding Method For Multi-Wire Signaling That Embeds Clock Information In Transition Of Signal State", filed Mar. 7, 2013, and U.S. Provisional Application No. 61/778,768 entitled "Transcoding Method For Multi-Wire Signaling That Embeds Clock Information In Transition Of Signal State", filed Mar. 13, 2013, all of which are assigned to the assignee hereof and hereby expressly incorporated by reference herein.

FIELD

The present disclosure pertains to transmitting a clock signal within cycles of a multi-wire data signal transfer.

BACKGROUND

In multi-signal data transfer, for example, multi-wire differential signaling such as 3-phase or N-factorial low-voltage differential signaling (LVDS), transcoding (e.g., the digital-to-digital data conversion of one encoding type to another) may be done to embed symbol clock information by causing symbol transition at every symbol cycle, instead of sending clock information in separate data lanes (differential transmission paths). Embedding clock information by such transcoding is an effective way to minimize skew between clock and data signals, as well as to eliminate the necessity of a phase-locked loop (PLL) to recover the clock information from the data signals.

Clock and data recovery (CDR) circuits are decoder circuits that extract data signals as well as a clock signals from multiple data signals. However, clock recovery from multiple data signals whose state transitions represent clock events often suffers unintended spike pulses on its recovered clock signal due to inter-lane skew of the data signals or glitch signals by intermediate or undeterminable data signal states at data transition times.

Therefore, an efficient glitch removal circuit is needed that minimizes analog delays and is scalable in multi-signal systems having different numbers of conductors.

SUMMARY

A clock recovery circuit is provided comprising a receiver circuit and a clock extraction circuit. The receiver circuit may be adapted to decode a differentially encoded signal on a plurality of data lines, where at least one data symbol is differentially encoded in state transitions of the differentially encoded signal. In one example, the plurality of data lines is three or more lines.

The clock extraction circuit may obtain a clock signal from state transition signals derived from the state transitions while compensating for skew in the different data lines, and masking data state transition glitches. The clock extraction circuit may include a feedback delayed instance of a first state transition signal (SDRCLK) that is used to obtain the clock signal.

In a first example, the clock extraction circuit may include a comparator, a set-reset latch, and an analog delay device. The comparator may compare a first instance of the first state transition signal (SI) and a level-latched instance of the first state transition signal (S) and outputs a comparison signal (NE). The set-reset latch may receive the comparison signal (NE) from the comparator and outputs a filtered version of the comparison signal (NEFLT). The analog delay device may receive the filtered version of the comparison signal (NEFLT) and outputs a delayed instance of the first state transition signal (SDRCLK), where the delayed instance of the first state transition signal (SDRCLK) is used to obtain the clock signal (DDRCLK). The set-reset latch may be reset based on the delayed instance of the first state transition signal (SDRCLK). The clock extraction circuit may further include a level latch that receives the first state transition signal (SI) and outputs the level-latched instance of the first state transition signal (S), where the level latch is triggered based on the delayed instance of the first state transition signal (SDRCLK).

In a second example, the clock extraction circuit may include a comparator, a set-reset latch, a first analog delay device, a one-shot logic, and a second analog delay device. The comparator may compare a first instance of the first state transition signal (SI) and a level-latched instance of the first state transition signal (S) and outputs a comparison signal (NE). The set-reset latch may receive the comparison signal (NE) from the comparator and outputs a filtered version of the comparison signal (NEFLT). The first analog delay device may receive the filtered version of the comparison signal (NEFLT) and outputs a delayed instance of the filtered version of the comparison signal (NEDEL). The one-shot logic may receive the filtered comparison signal (NEFLT) and the delayed instance of the filtered version of the comparison signal (NEDEL) and outputs a second filtered version of the comparison signal (NE1SHOT). The second analog delay device may receive the second filtered version of the comparison signal (NE1SHOT) and outputs a delayed instance of the first state transition signal (SDRCLK), where the delayed instance of the first state transition signal (SDRCLK) is used to obtain the clock signal (DDRCLK). The set-reset latch may be reset based on the delayed instance of the first state transition signal (SDRCLK). The clock extraction circuit may further include a level latch that receives the first state transition signal (SI) and outputs the level-latched instance of the first state transition signal (S), where the level latch is triggered based on the delayed instance of the first state transition signal (SDRCLK).

In a third example, the clock extraction circuit may include a comparator, a set-reset latch, a first analog delay device, a one-shot logic, a second analog delay device, and a third analog delay device. The comparator may compare a first instance of the first state transition signal (SI) and a level-latched instance of the first state transition signal (S) and outputs a comparison signal (NE). The set-reset latch may receive the comparison signal (NE) from the comparator and outputs a filtered version of the comparison signal (NEFLT). a first analog delay device that receives the filtered version of the comparison signal (NEFLT) and outputs a delayed instance of the filtered version of the comparison signal (NEDEL). The one-shot logic may receive the filtered comparison signal (NEFLT) and the delayed instance of the filtered version of the comparison signal (NEDEL) and outputs a second filtered version of the comparison signal (NE1SHOT). The second analog delay device may receive the second filtered version of the comparison signal (NE1SHOT) and outputs a first delayed instance of the first state transition signal (SDRCLK0), where the first delayed instance of the first state transition signal (SDRCLK0) is used to obtain the clock signal. The third analog delay device may receive the first delayed instance of the first state transition signal (SDRCLK0) and outputs a second delayed instance of the first state transition signal (SDRCLK). The set-reset latch may be reset based on the second delayed instance of the first state transition signal (SDRCLK). The clock extraction circuit may further include a level latch that receives the first state transition signal (SI) and outputs the level-latched instance of the first state transition signal (S), where the level latch is triggered based on the second delayed instance of the first state transition signal (SDRCLK).

In a fourth example, the clock extraction circuit may include a comparator, a set-reset latch, a first analog delay device, a one-shot logic, a second analog delay device, a third analog delay device, and a flip-flop. The comparator may compare a first instance of the first state transition signal (SI) and a level-latched instance of the first state transition signal (S) and outputs a comparison signal (NE). The set-reset latch may receive the comparison signal (NE) from the comparator (1304) and outputs a filtered version of the comparison signal (NEFLT). The first analog delay device may receive the filtered version of the comparison signal (NEFLT) and outputs a delayed instance of the filtered version of the comparison signal (NEDEL). The one-shot logic may receive the filtered comparison signal (NEFLT) and the delayed instance of the filtered version of the comparison signal (NEDEL) and outputs a second filtered version of the comparison signal (NE1SHOT). The second analog delay device may receive the second filtered version of the comparison signal (NE1SHOT) and outputs a first delayed instance of the first state transition signal (SDRCLK1), where the first delayed instance of the first state transition signal (SDRCLK1) is used to obtain the clock signal. The third analog delay device may receive the first delayed instance of the first state transition signal (SDRCLK1) and outputs a second delayed instance of the first state transition signal (SDRCLK2). The flip flop may receive the first state transition signal (SI) and outputs the level-latched instance of the first state transition signal (S), where the level latch is triggered based on the first delayed instance of the first state transition signal (SDRCLK2). The set-reset latch may be reset based on the second delayed instance of the first state transition signal (SDRCLK2).

A method for recovering a clock signal is also provided. A differentially encoded signal on a plurality of data lines is decoded, where at least one data symbol is differentially encoded in state transitions of the differentially encoded signal. A clock signal is obtained from state transition signals derived from the state transitions while compensating for skew in the different data lines, and masking data state transition glitches. Data is extracted from the decoded differentially encoded signal. The clock signal is a feedback delayed instance of a first state transition signal (SDRCLK) that is used to obtain the clock signal.

In a first example, the clock signal may be obtained by: (a) comparing a first instance of the first state transition signal (SI) and an instance of the first state transition signal (S) to provide a comparison signal (NE); (b) filtering the comparison signal (NE) to provide a filtered version of the comparison signal (NEFLT); and/or (c) delaying the filtered version of the comparison signal (NEFLT) to provide a delayed instance of the first state transition signal (SDRCLK), where the delayed instance of the first state transition signal (SDRCLK) is used to obtain the clock signal (DDRCLK).

In a second example, the clock signal may be obtained by: (a) comparing a first instance of the first state transition signal (SI) and a level-latched instance of the first state transition signal (S) to provide a comparison signal (NE); (b) filtering the comparison signal (NE) to provide a filtered version of the comparison signal (NEFLT); (c) delaying the filtered version of the comparison signal (NEFLT) to provide a delayed instance of the filtered version of the comparison signal (NEDEL); (d) logically combining the filtered comparison signal (NEFLT) and the delayed instance of the filtered version of the comparison signal (NEDEL) to obtain a second filtered version of the comparison signal (NE1SHOT); and/or (d) delaying the second filtered version of the comparison signal (NE1SHOT) to provide a delayed instance of the first state transition signal (SDRCLK), where the delayed instance of the first state transition signal (SDRCLK) is used to generate the clock signal (DDRCLK).

In a third example, the clock signal is obtained by: (a) comparing a first instance of the first state transition signal (SI) and a level-latched instance of the first state transition signal (S) to provide a comparison signal (NE); (b) filtering the comparison signal (NE) to provide a filtered version of the comparison signal (NEFLT); (c) delaying the filtered version of the comparison signal (NEFLT) to provide a delayed instance of the filtered version of the comparison signal (NEDEL); (d) logically combining the filtered comparison signal (NEFLT) and the delayed instance of the filtered version of the comparison signal (NEDEL) to provide a second filtered version of the comparison signal (NE1SHOT); (e) delaying the second filtered version of the comparison signal (NE1SHOT) to provide a first delayed instance of the first state transition signal (SDRCLK0), where the first delayed instance of the first state transition signal (SDRCLK0) is used to generate the clock signal; and/or (f) delaying the first delayed instance of the first state transition signal (SDRCLK0) to provide a second delayed instance of the first state transition signal (SDRCLK).

In a fourth example, the clock signal is obtained by: (a) comparing a first instance of the first state transition signal (SI) and a level-latched instance of the first state transition signal (S) to provide a comparison signal (NE); (b) filtering the comparison signal (NE) to provide a filtered version of the comparison signal (NEFLT); (c) delaying the filtered version of the comparison signal (NEFLT) to provide a delayed instance of the filtered version of the comparison signal (NEDEL); (d) logically combining the filtered comparison signal (NEFLT) and the delayed instance of the filtered version of the comparison signal (NEDEL) to provide a second filtered version of the comparison signal (NE1SHOT); (e) delaying the second filtered version of the comparison signal (NE1SHOT) to provide a first delayed instance of the first state transition signal (SDRCLK1), where the first delayed instance of the first state transition signal (SDRCLK1) is used to generate the clock signal; and/or (f) delaying the first delayed instance of the first state transition signal (SDRCLK1) to provide a second delayed instance of the first state transition signal (SDRCLK2). The level-latched instance of the first state transition signal (S) may be obtained from a level latch that is triggered based on the first delayed instance of the first state transition signal (SDRCLK2).

DRAWINGS

Various features, nature and advantages may become apparent from the detailed description set forth below when taken in conjunction with the drawings in which like reference characters identify correspondingly throughout.

DETAILED DESCRIPTION

In the following description, specific details are given to provide a thorough understanding of the embodiments. However, it will be understood by one of ordinary skill in the art that the embodiments may be practiced without these specific detail. For example, circuits may be shown in block diagrams in order not to obscure the embodiments in unnecessary detail. In other instances, well-known circuits, structures and techniques may not be shown in detail in order not to obscure the embodiments.

Overview

Various clock recovery circuits are herein provided that implement glitch removal techniques with limited number of analog delays.

In one example, a receiver circuit is adapted to decode a differentially encoded signal on a plurality of data lines, where at least one data symbol is differentially encoded in state transitions of the differentially encoded signal. A clock extraction circuit obtains a clock signal from state transition signals derived from the state transitions while compensating for skew in the different data lines, and masking data state transition glitches.

While certain examples herein may describe a particular type of multi-wire transmission, it is contemplated that the clock recovery circuits descripted herein may be implemented with many different types of multi-wire transmission system.

Exemplary 3-Wire Transcoding System with Embedded Timing Information

Figure 1:
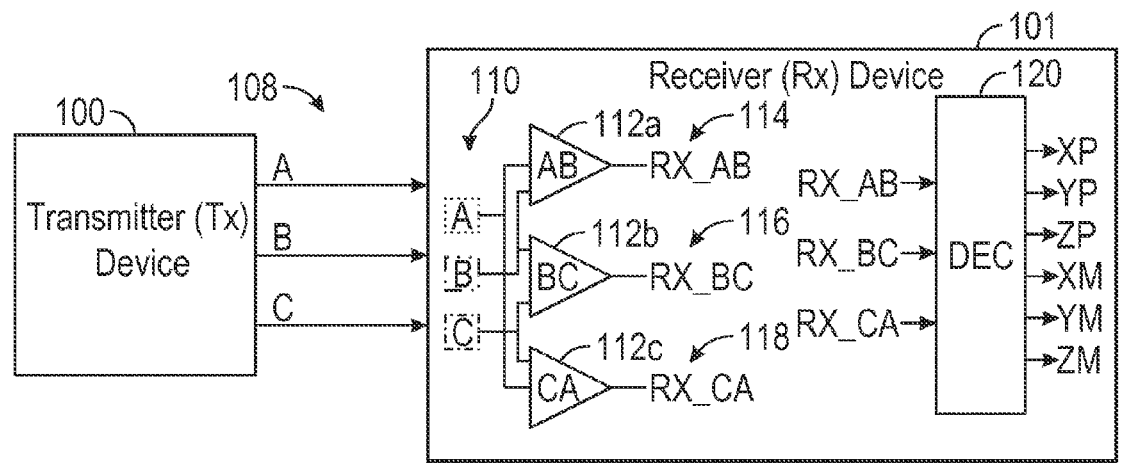
FIG. 1 illustrates a 3-wire differential signaling scheme between a transmitter device and a receiver device based on a circular state diagram.
Figure 1:
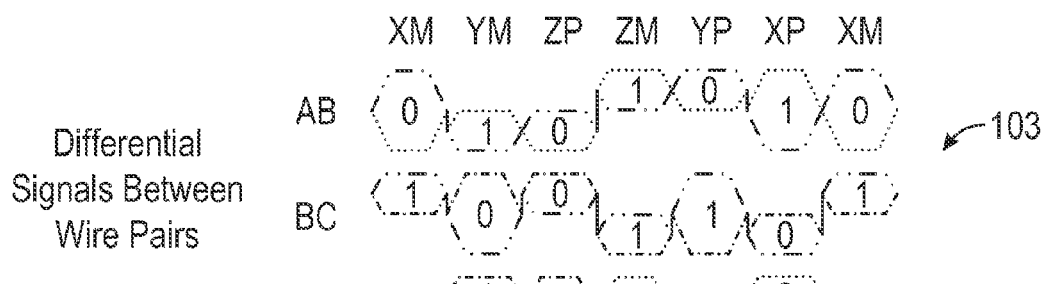
Figure 1:
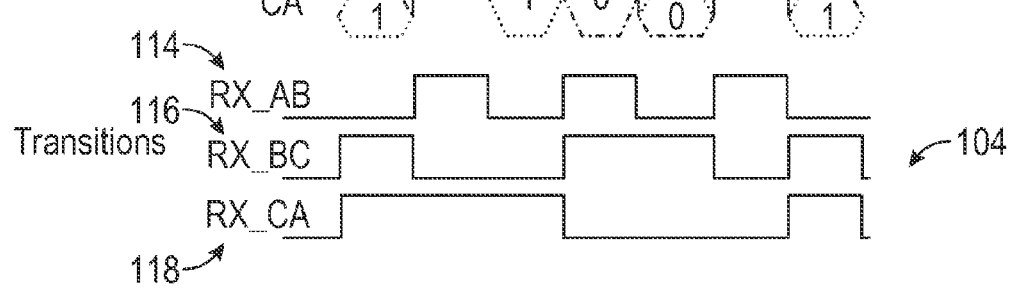
Figure 1:
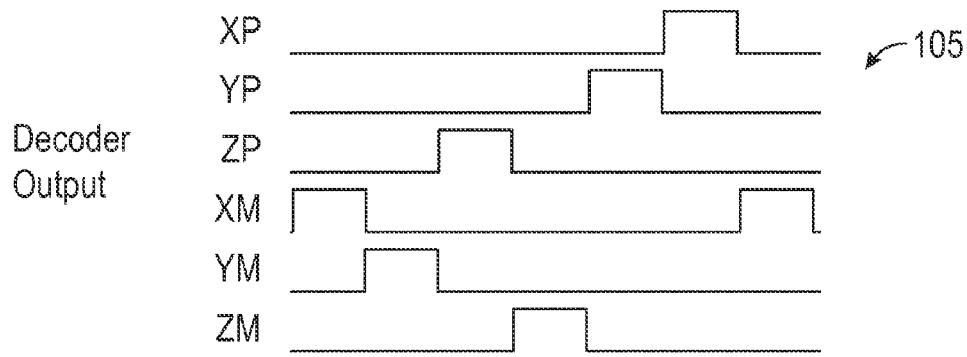

FIG. 1 illustrates a 3-wire differential signaling scheme between a transmitter device 100 and a receiver device 101 based the states defined by differential signals among conductors A, B, and C. The transmitter device 100 and receiver device 101 may communicate over a multi-line bus 108. In this example, three lines A, B, and C are used for the bus 108. The receiver device 101 may include a three-port receiver 110 to couple the receiver device 101 to the bus 108.

In one example, differential signal encoding may be used to transmit signals from the transmitter device 100 the receiver device 101. Consequently, each of a plurality of receivers 112 may be configured to take two of the three lines A, B, and C and provide a different signal. For instance, a first line A and a second line B may serve to provide a first differential signal RX_AB 114, the second line B and a third line C may serve to provide a second differential signal RX_BC 116, and the first line A and the third line C may serve to provide a third differential signal RX_CA 118 RX. These differential signals 114, 116, and 118 may serve as inputs to a decoder circuit 120. The decoder circuit 120 decodes the three differential signals RX_AB 114, RX_BC 116, and RX_CA 118 and outputs the six states XM, YM, ZM, ZP, YP, and XP.

A state diagram 103 illustrates the six (6) states XM, YM, ZM, ZP, YP, and XP that may be defined by the differential signals 114, 116, and 118 carried by the three conductors A, B, and C of the bus 108. As can be observed, the voltage levels across the three differential signals 114, 116, and 118 may be mapped to different combinations of ones (1) and zeros (0). For instance, the differential signal voltage levels for state XM may be associated with "011", state YM may be associated with "101", state ZP may be associated with "001", state ZM may be associated with "110", state YP may associated with "010", and state XP may be associated with "100".

In addition to the information encoded in the states (e.g., 3 bits per state), information may also be encoded based on transitions between the states. Note that transition between any two states (XM, YM, ZM, ZP, YP, and XP) occurs in a single step without traversing intermediate states. As such, differential data transmission schemes based on the state diagram 103 would be free of state transition decoding problems.

Each of the conductors of the bus 108 may be driven High, driven Low, or undriven, with only one conductor being undriven in any single cycle. In one embodiment, three differential signals, RX_AB 114, RX_BC 116, and RX_CA 118 (e.g., received by a decoder 120 within receiver device 101), are defined as positive differential voltage to logic 1 and negative differential voltage to logic 0 between conductor A relative to conductor B, conductor B relative to conductor C, and conductor C relative to conductor A respectively. Example waveforms of the three differential signals 114, 116, and 118 are illustrated in the diagram 104.

Six possible states (excluding the states that cause a zero differential voltage between conductor A relative to conductor B, conductor B relative to conductor C, and conductor C relative to conductor A) are defined as XM, YM, ZP, ZM, YP, XP, and XM by states of the signals RX_AB 114, RX_BC 116, and RX_CA 118 according to state diagram 103.

State signals corresponding to the six possible states XM, YM, ZP, ZM, YP, XP, and XM are generated from the differential signals RX_AB 114, RX_BC 116, and RX_CA 118 by a decoder block 120 (DEC), in the receiver device 101, and examplary waveforms of the state signals are shown in the diagram 105.

In one embodiment, a state transition from a state, XM, YM, ZP, ZM, YP, XP, or XM, to a different state always occurs at any single cycle in a way that a state transition represents data to be transmitted from the transmitter device 100 to the receiver device 101.

Figure 2:
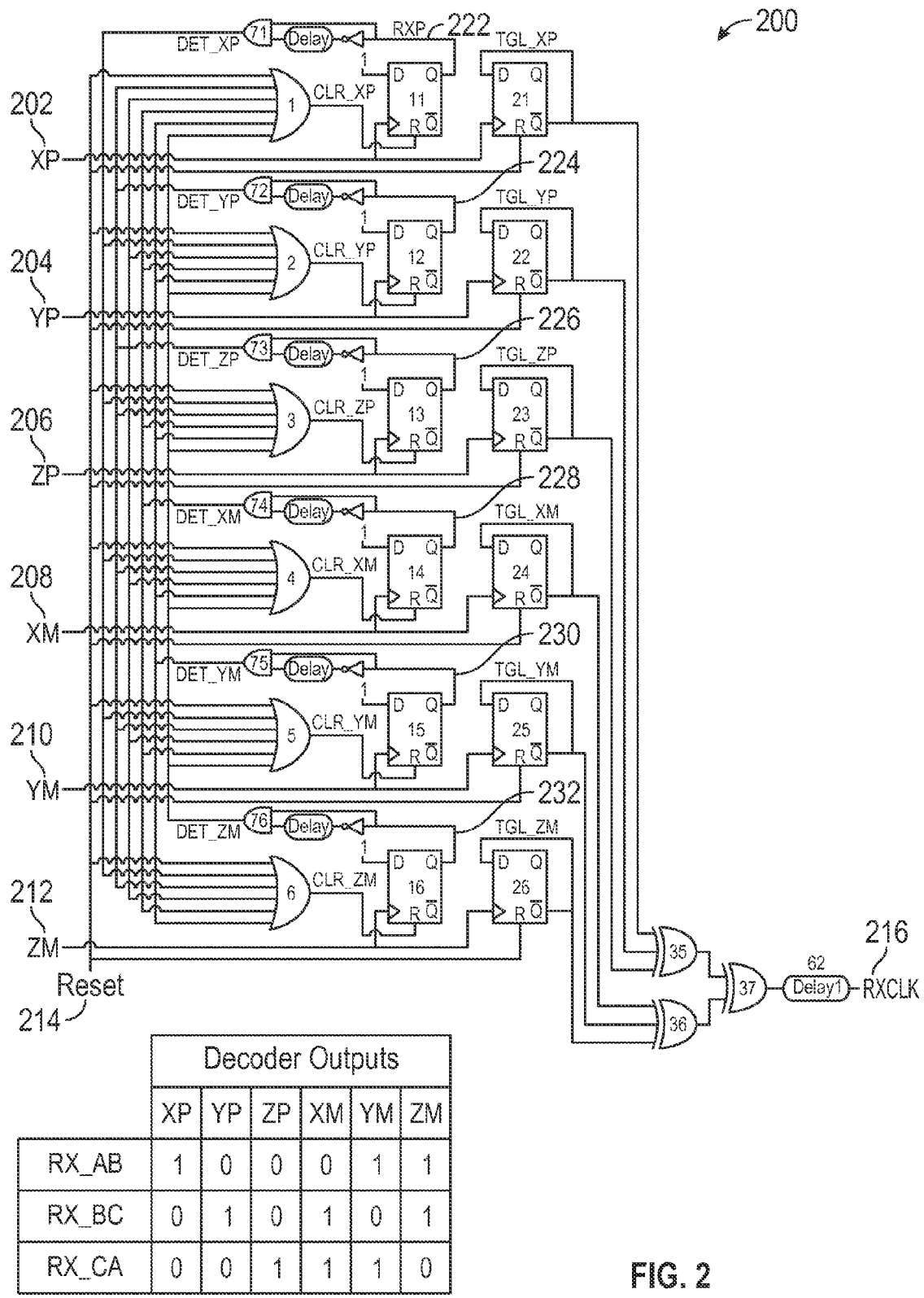
FIG. 2 illustrates an example clock recovery circuit (e.g., decoder) which can be used to decode data transmitted according to a 3-wire differential signaling scheme.

FIG. 2 illustrates an example clock recovery circuit 200 (e.g., decoder) which can be used to recover a clock signal from the data signals transmitted according to a 3-wire differential signaling scheme. Other clock recovery circuit implementations can also be used as would be understood by a person skilled in the art based on the teachings herein. Clock recovery circuit 200 receives input signals XP 202, YP 204, ZP 206, XM 208, YM 210, and ZM 212 from preceding analog circuits (e.g., from decoder 120 in FIG. 1). At any time, only one of the signals XP 202, YP 204, ZP 206, XM 208, YM 210, and ZM 212 can have a value of one (as illustrated in 105), depending on which of the data states just occurred. Inputs signals XP 202, YP 204, ZP 206, XM 208, YM 210, and ZM 212 are respectively coupled to the clock inputs of D flip flops 11-16. Each of D flip flops 11-16 has its D data input coupled to a logic one, which causes its Q output to have a value of one whenever its respective clock input experiences a rising edge transition. For example, D flip flop 11 will have a Q output of one whenever input signal 202 experiences a rising edge transition, or equivalently, whenever state A-to-B positive occurs. As such, D flip flops 11-16 capture which of the six states has just occurred, as indicated by their respective Q outputs. Since only one state can occur at any time, only one of the Q outputs (from D flip flops 11-16) can continue to have a value of one at any time. As will be further described below, there will be a short overlap whenever a new state occurs with the Q outputs corresponding to the current state and the new state both having a value of one for the duration of the delay to reset the flip-flops.

When any of the states is captured by one of D flip flops 11-16, the other flip flops will be reset. In the clock recovery circuit 200, this is achieved using OR gates 1-6, which generate reset signals for respective D flip flops 11-16. OR gates 1-6 each receives as inputs pulses caused by rising edges on the Q outputs of D flip flops 11-16 except for the Q output of its respective D flip-flop and a Reset signal 214. For example, OR gate 1 receives pulses caused by rising edges on the Q outputs 224, 226, 228, 230, and 232 (but not Q output 222 of its respective D flip flop 11) of D flip-flops 12-16 and Reset signal 214. Accordingly, the output of OR gate 1 will be one whenever any state other than A-to-B positive occurs or if Reset signal 214 is asserted. One the other hand, when state A-to-B positive occurs and Reset signal 241 is not asserted, OR gate 1 will output a value of zero.

In an embodiment, to ensure that D flip-flops 11-16 are only reset momentarily when a non-respective state occurs, the Q outputs of D flip-flops 11-16 are coupled to OR gates 1-6 through a circuitry, which ensures that OR gates 1-6 are only provided with a pulse and not a continuous signal of value one. For example, Q output 222 of D flip-flop 11 is coupled to OR gates 2-6 through an AND gate 71. AND gate 71 receives as inputs Q output 222 and a delayed inverted version of Q output 222. Note that right before D flip-flop 11 captures an A-to-B positive state occurrence, the output of AND gate 71 is zero because Q output 222 is zero (D flip-flop 11 would have been reset previously). On the other hand, the delayed inverted version of Q has a value of one. When the A-to-B positive input occurs, Q output 222 changes to one. The delayed inverted version of Q maintains a value of one for the duration of the delay (generated by a delay element as illustrated) before changing to zero. Accordingly, for the duration of the delay, AND gate 71 will output a value of one, creating a pulse which resets flip-flops 12-16.

D flip-flops 21-26 are used to generate a double data rate clock signal Rx_Clk 216, which transitions whenever a new input is presented. D flip-flops 21-26 respectively receive as clock inputs input signals 202, 204, 206, 208, 210, and 212. D flip-flops 21-26 also receive Reset signal 214. As shown in FIG. 2, each of D flip flops 21-26 has its Q_bar output fed back to its D data input. As such, for each of D flip-flops 21-26, whenever its respective input clock signal experiences a rising edge transition, its Q_bar output will toggle from one to zero or from zero to one. The Q_bar outputs of D flip-flops 21-26 are input together through XOR gates 35 and 36, as illustrated in FIG. 2. The outputs of XOR gates 35 and 36 are, in turn, input together through XOR gate 37. XOR gate 37 will output a value of one whenever an odd number of the Q_bar outputs of D flip-flops 21-26 have a value of one. Since only one of the Q_bar outputs of D flip-flops 21-26 will toggle at any one time while the others will maintain the same value, the output of XOR 37 will toggle for each change in inputs 202, 204, 206, 208, 210, and 212. This generates double data rate clock signal Rx_Clk 216. In an embodiment, a delay element 62 is used to ensure that Rx_Clk signal is in sync with the other signals that are output by clock recovery circuit 200.

Figure 3:
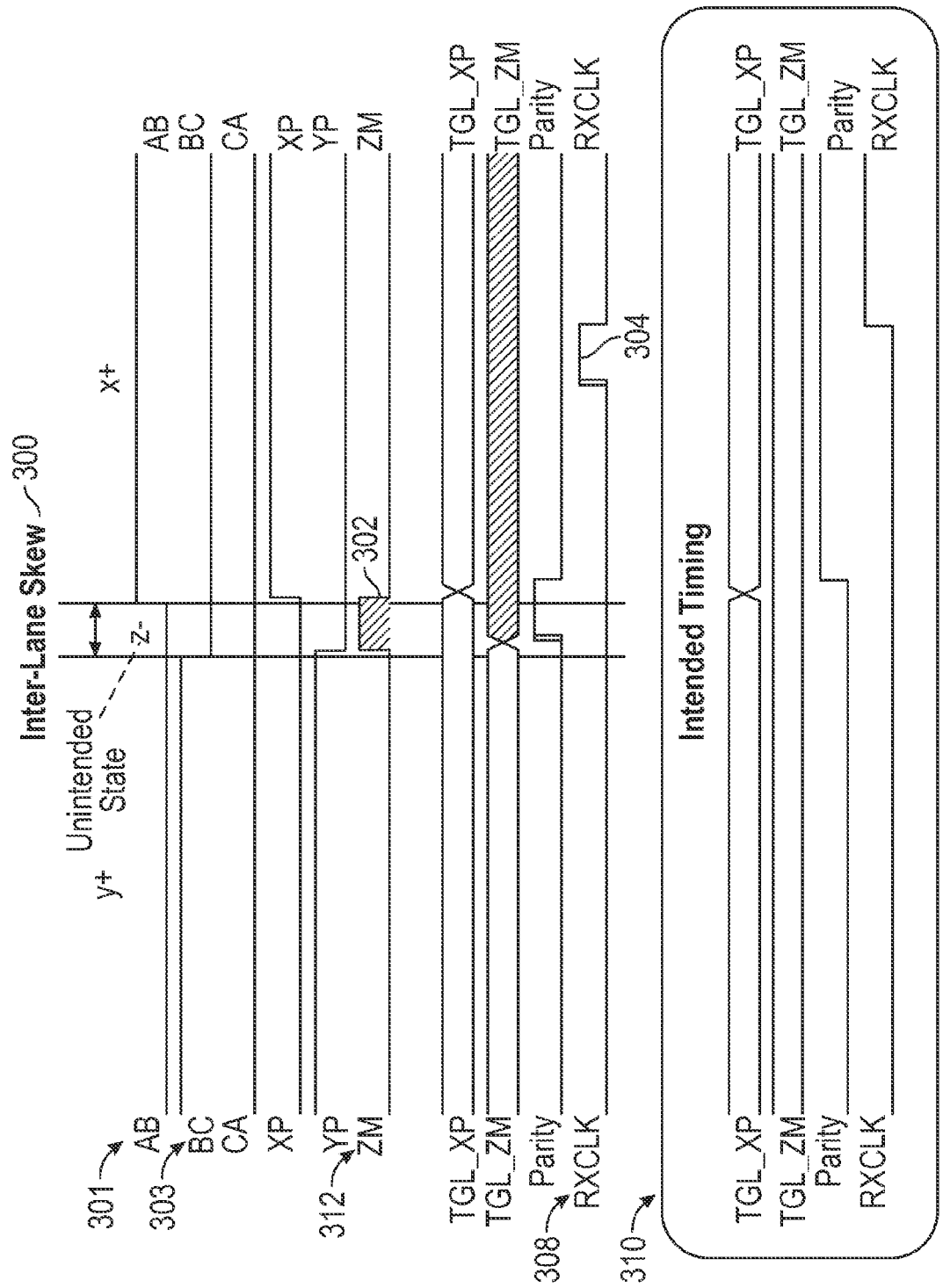
FIG. 3 is a timing diagram for the clock recovery circuit of FIG. 2.

FIG. 3 is a timing diagram for the clock recovery circuit 200 of FIG. 2. In particular, this timing diagram illustrates that inter-lane skew 300, (e.g., timing difference between the AB lane 301 and BC lane 303) may cause an unintended state 302 to be sensed. This may result in an extra toggle 304 in the RXCLK recovered double data rate clock 308 (RXCLK) which is fatal in data communications. A timing diagram 310 of the intended (correct) timing signals is also shown with no unintended state.

Figure 4:
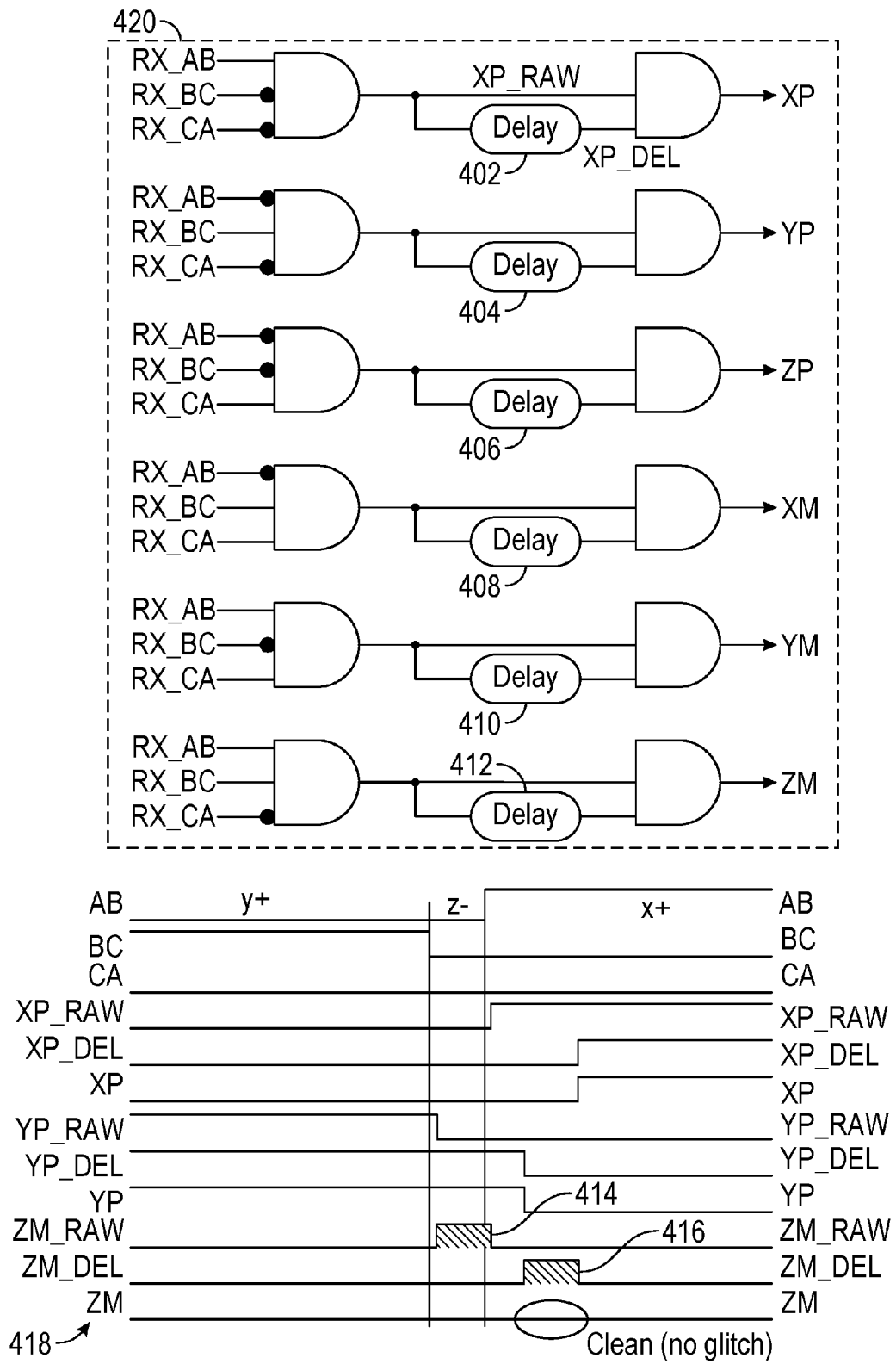
FIG. 4 illustrates a solution to the inter-lane skew of FIG. 3 in which a delay is introduced in the clock recovery circuit (decoder) so that the unintended state is delayed sufficiently that it no longer causes a glitch on the recovered clock RXCLK.

FIG. 4 illustrates a decoder circuit 420 that may serve to eliminate the inter-lane skew of FIG. 3. In one example, the decoder circuit 420 may be the decoder circuit 120 in FIG. 1. To address the inter-lane skew of FIG. 3 a delay 402, 404, 406, 408, 410, 412 is introduced in the decoder circuit 420 (decoder) to cause the unintended state 414 to be delayed 416 sufficiently so that it no longer causes a glitch on the recovered clock RXCLK. Relative to the ZM line 312 in FIG. 3, the ZM line 418 in FIG. 4 no longer has a glitch. The problem with this solution is that additional delays are needed as more wires added. For instance, in an N-factorial (N!) system, for a four-wire system, twenty-four (24) delays would be needed, for a five-wire system, one-hundred twenty (120) delays would be needed. Additionally, such delays must be sufficiently long to accommodate to remove glitches caused by inter-lane skew, but this is wasteful and can degrade decoder performance.

Figure 5:
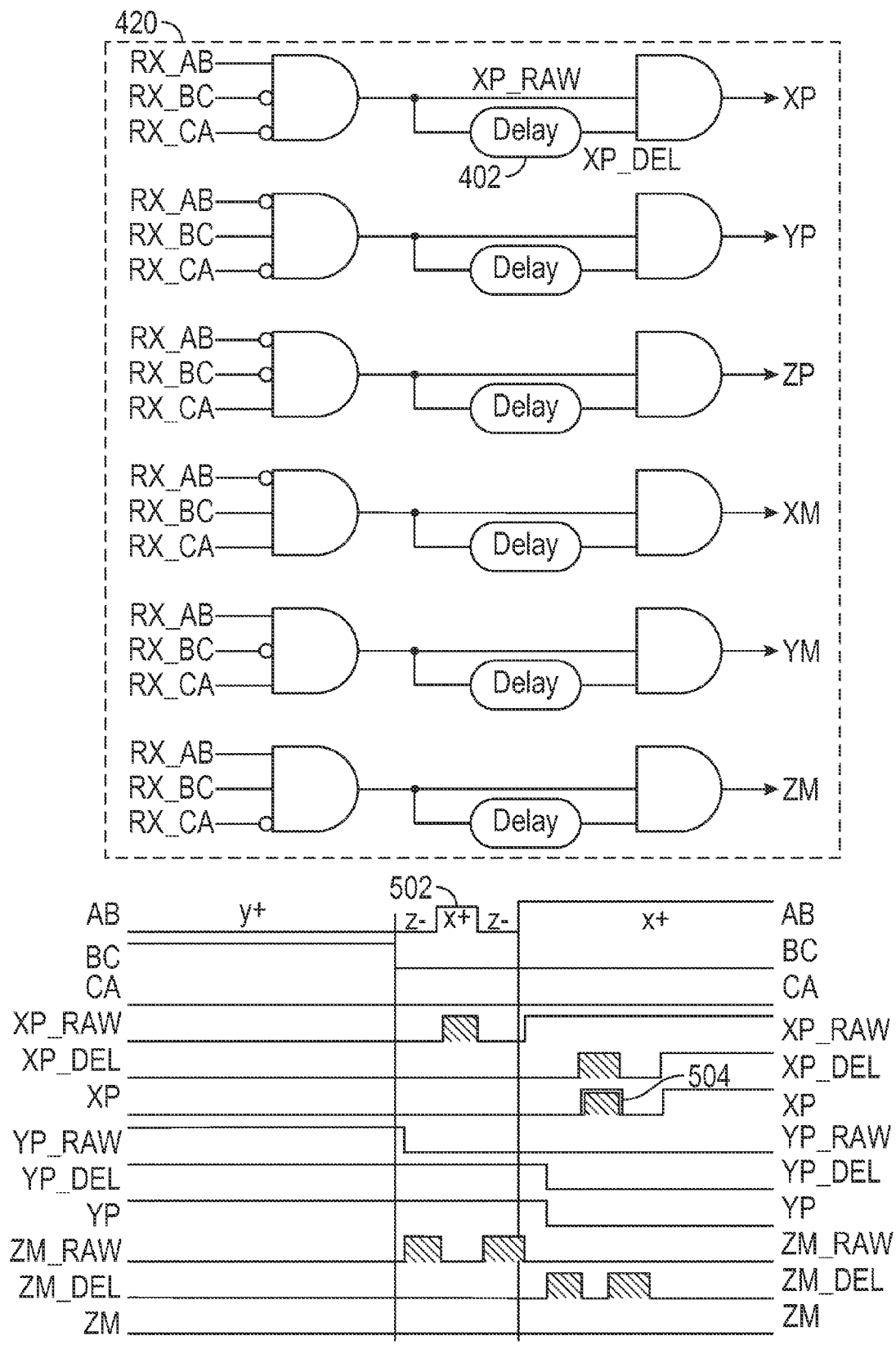
FIG. 5 is a timing diagram illustrating a timing diagram in which a glitch occurs in the AB transition that cannot be masked out by the delay.

FIG. 5 is a timing diagram illustrating a timing diagram in which a glitch 502 occurs in the AB transition that cannot be masked out by the delay 402 (FIG. 4). Consequently, such glitch is propagated 504 despite the delay 402 being used in the decoder 420.

Figure 6:
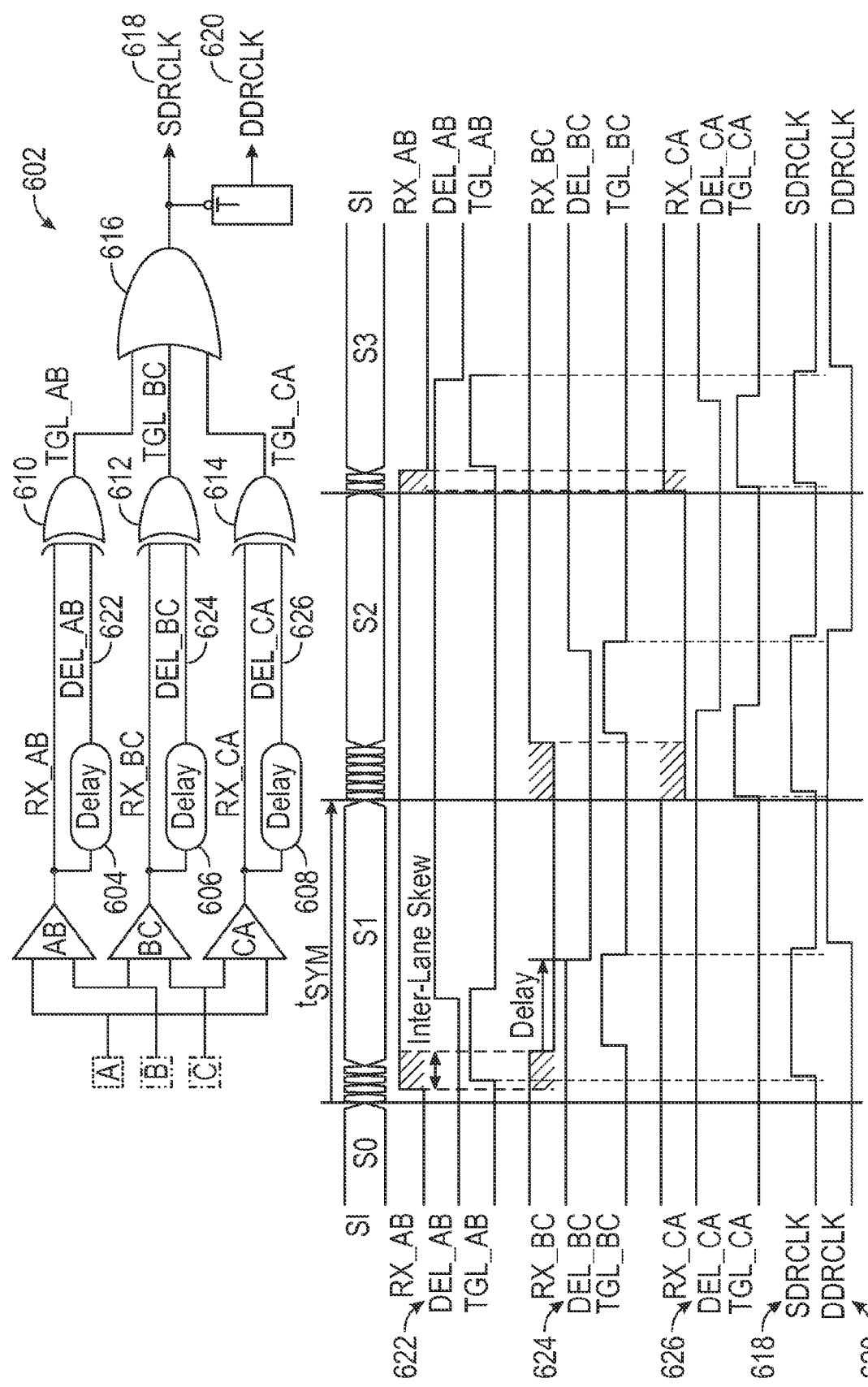
FIG. 6 is an alternate clock recovery circuit in which a one-shot circuit is used after the data receiver circuit to remove the inter-lane skew.

FIG. 6 is an alternate clock recovery circuit in which a one-shot circuit 602 is used after the data receiver circuit to remove the inter-lane skew. This one-shot circuit 602 (which includes delays 604, 606, 608, XOR gates 610, 612, and 614, and an OR gate 616) triggers off the falling edge of the SDRCLK line 618 to recover a DDRCLK 620. One advantage with this circuit 602 is that only as many delays as lines are used (i.e., three lines A, B, C, and three delays 604, 606, and 608), so it scales better than the circuit in FIGS. 4 and 5 (which require more delays for the same three lines). However, this circuit does not address the problem of glitches, due to inter-lane skew, within transition periods illustrated in FIG. 5.

Figure 7:
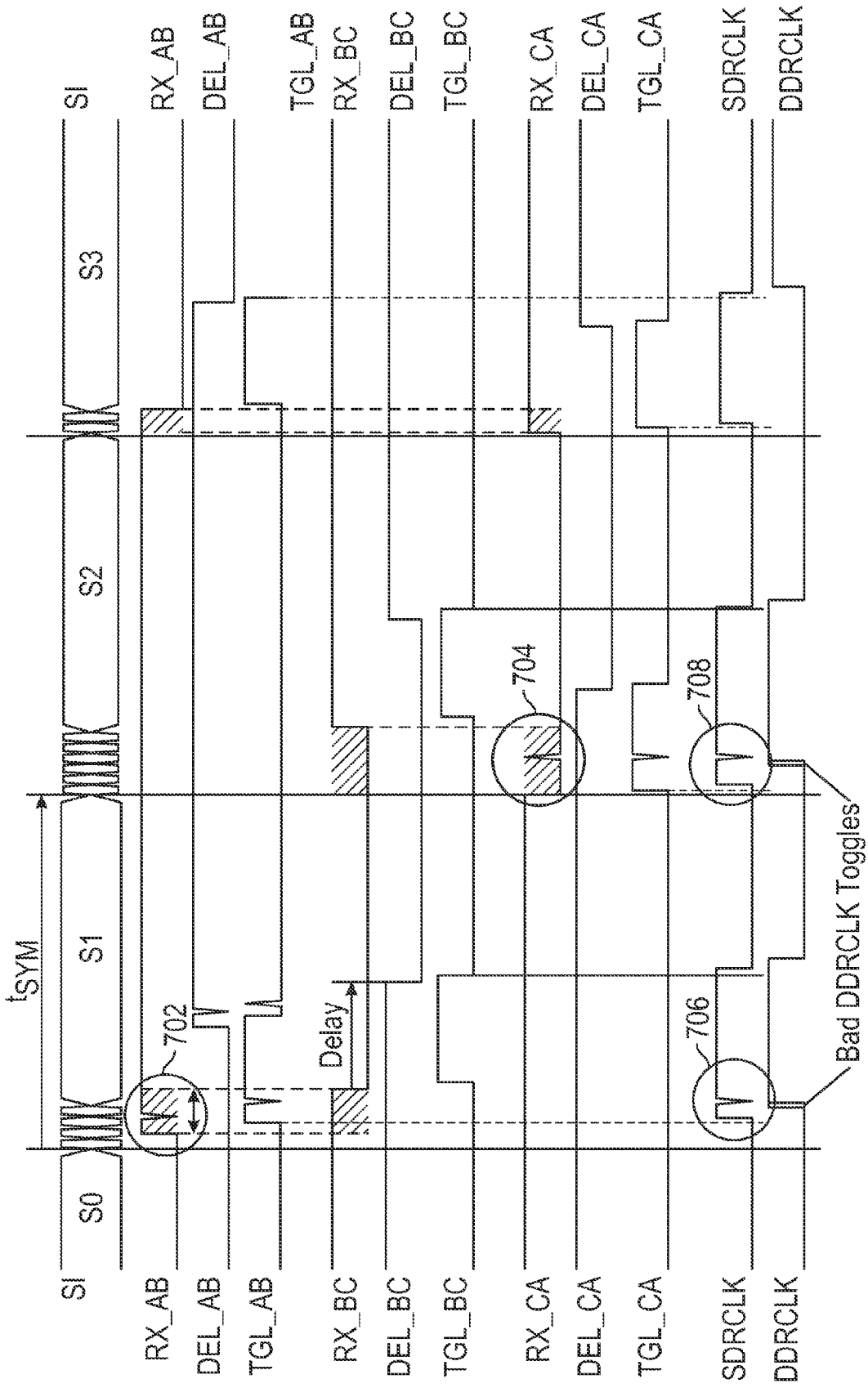
FIG. 7 illustrates that a glitches transition periods may cause incorrect or erroneous DDRCLK toggles in the clock recovery circuit shown in FIG. 6.

FIG. 7 illustrates that a glitches 702 and 704 transition periods may cause incorrect or erroneous DDRCLK toggles 706 and 708.

Exemplary Scalable Clock Extraction Circuit and Method

According to one example, a clock recovery circuit is provided including a receiver circuit and a clock extraction circuit. The receiver circuit may be adapted to decode a differentially encoded signal on a plurality of data lines, where at least one data symbol is differentially encoded in state transitions of the differentially encoded signal. The clock extraction circuit may obtain a clock signal from state transition signals derived from the state transitions while compensating for skew in the different data lines, and masking data state transition glitches. In various examples, the plurality of data lines may be three or more lines. The clock extraction circuit may include a feedback delayed instance of a first state transition signal (SDRCLK) that is used to obtain the clock signal.

Figure 14:
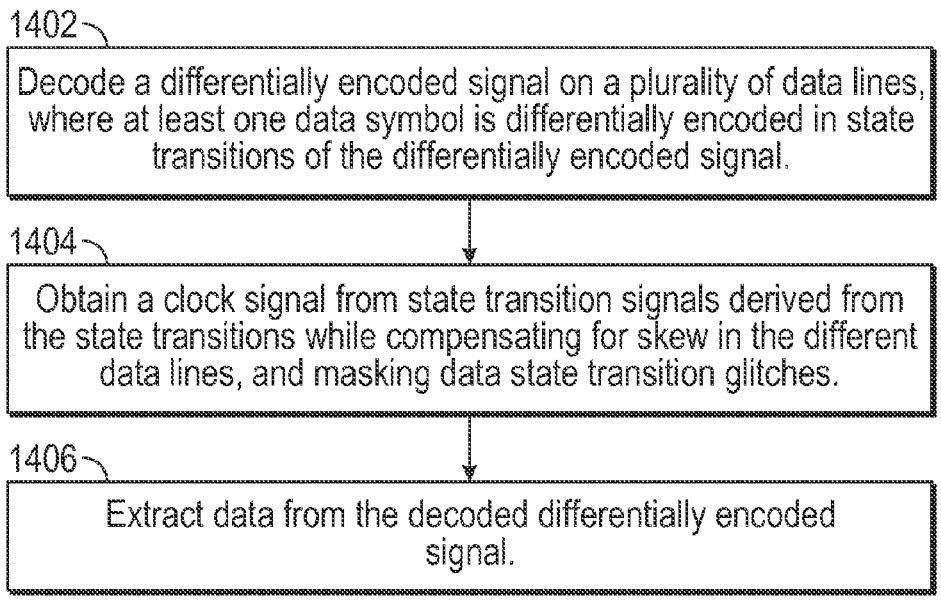
FIG. 14 is a method operational in a device to recover a clock signal.

FIG. 14 is a method operational in a device to recover a clock signal. A differentially encoded signal on a plurality of data lines may be decoded, where at least one data symbol is differentially encoded in state transitions of the differentially encoded signal 1402. A clock signal may be obtained from state transition signals derived from the state transitions while compensating for skew in the different data lines, and masking data state transition glitches 1404. Additionally, data may be extracted from the decoded differentially encoded signal 1406. The clock signal may be a feedback delayed instance of a first state transition signal (SDRCLK) that is used to obtain the clock signal.

First Exemplary Multi-Wire Transmission System with Scalable Clock Extraction

Figure 8:
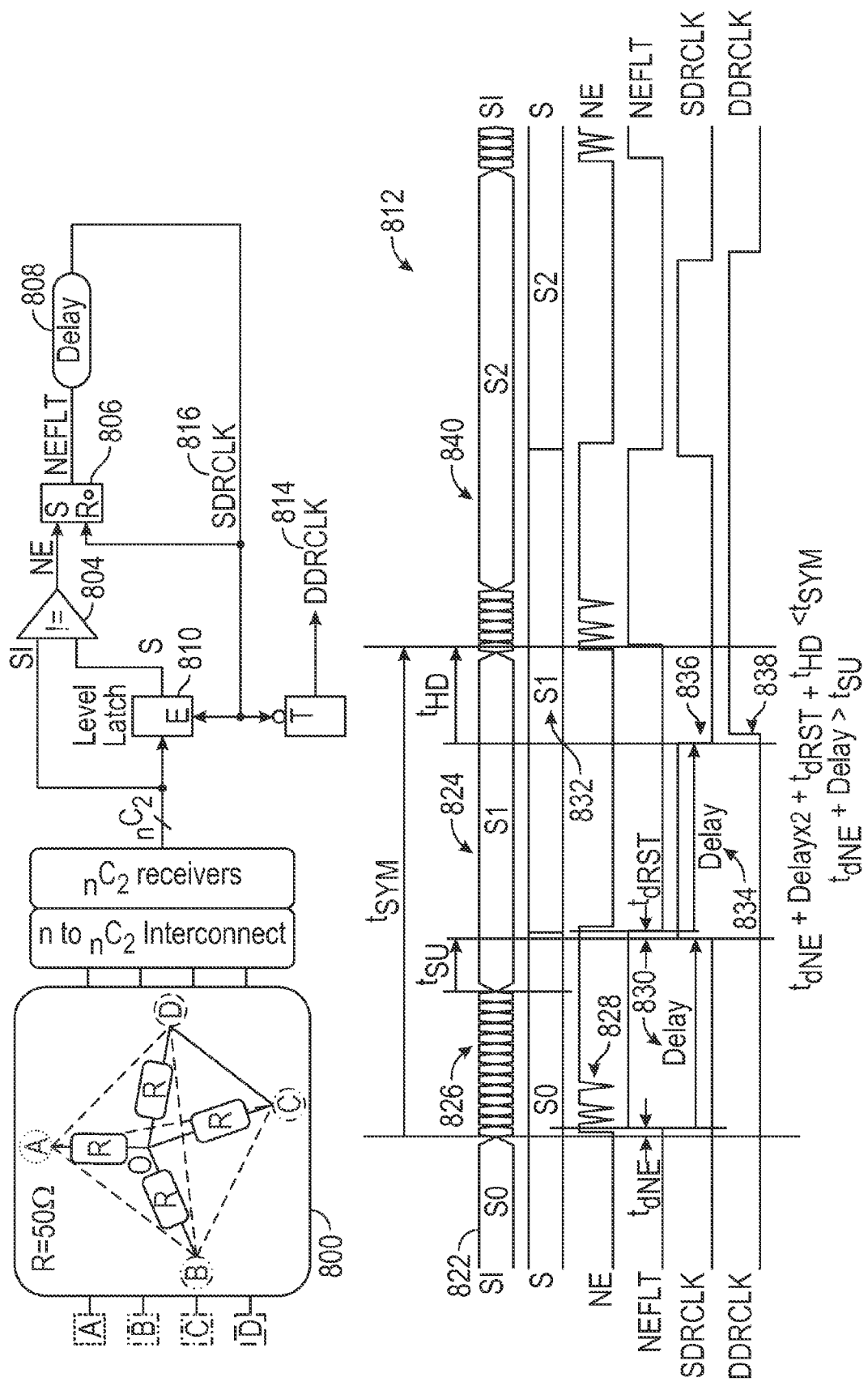
FIG. 8 illustrates a clock and data transmission scheme for a 4-wire differential signaling system with embedded clock information.

FIG. 8 illustrates a clock and data transmission scheme for a 4-wire system 800 with embedded clock information. As can be appreciated here, for each raw signal output SI from each different receiver there is a setup time between symbols S0, S1, S2, . . . , during which the state of that line is unstable. The present 4-wire system 800 uses a level latch 810, a comparator 804, and latch 806, and an analog delay 808 to generate a signal S on a delay which serves to reset the signal S itself.

This clock extraction circuit includes a comparator 804, a set-reset latch 806, an analog delay device 808, and a (bused) level latch 810. The comparator 804 may compare a first instance of the first state transition signal (SI) and a level-latched instance of the first state transition signal (S) and outputs a comparison signal (NE). The set-reset latch 806 may receive the comparison signal (NE) from the comparator 804 and outputs a filtered version of the comparison signal (NEFLT). The analog delay device 808 may receive the filtered version of the comparison signal (NEFLT) and outputs a delayed instance of the first state transition signal (SDRCLK), where the delayed instance of the first state transition signal (SDRCLK) is used to generate the clock signal (DDRCLK).

The level latch 810 may receive the first state transition signal (SI) and outputs the level-latched instance of the first state transition signal (S), where the level latch 810 is triggered based on the delayed instance of the first state transition signal (SDRCLK).

In one example, the comparator 804 may compare the SI signal and a signal S (output from the level latch 810) and generates a not equal NE signal that serves as input into the latch 806. The comparator 804 outputs a High when signals SI and S are not equal (i.e., they are different symbols) and a Low when signals SI and S are equal (i.e., they are the same symbol).

As can be appreciated from the timing diagram 812 signal S is just a delayed and filtered version of signal SI where the glitches have been removed due to the delay 808. Importantly, the comparator 804 and delay of the signal S causes the setup glitches in the signal NE to be masked in the NEFLT signal. As a result, the feedback and delays in this circuit, the SDRCLK 816 and DDRCLK 814 are resistant to line skew and glitches in the symbol transitions.

The following definitions are used in the timing diagram 812 signal:

$t_{sym}$: one symbol cycle period, $t_{SU}$: setup time of SI for the level latches 810 referenced to the rising (leading) edge of SDRCLK 816, $t_{HD}$: hold time of SI for the level latches 810 referenced to the falling (trailing) edge of SDRCLK 816, $t_{dNE}$: propagation delay of the comparator 804, $t_{dRST}$: reset time of the set-reset latch 806 from the rising (leading) edge of SDRCLK 816.

Initially, signals SI and S hold the previous symbol value S0 822. Signals NE, NEFLT, and SDRCLK are zero. The DDRCLK 814 is stable but can be either high or low.

When a new symbol value S1 824 is being received, it causes signal SI to start changing its value. The SI value may be different from S1 824 (valid data) due to the possibility of receiving intermediate or indeterminate states 826 of the signal transition (from S0 to S1) that may be caused, for example, by inter-wire skew, over/under shoot, cross-talk, etc.

The NE signal becomes high as soon as the comparator 804 detects different value between SI and S, and that asynchronously sets the set-reset latch 806 output, NEFLT signal, high after tdNE, which hold its high state until it is reset by a high state of SDRCLK 816 which will arrive approximately a Delay period (caused by analog delay 808) after rising of NEFLT signal.

The intermediate states at SI (invalid data) may contain a short period of symbol value S0 822 causing the comparator 804 output NE signal to turn back low for short period (spikes 828 in the NE signal). The low state of the NE signal will not affect the set-reset latch 806 output, NEFLT signal, since the set-reset latch 806 effectively filters out spikes on the NE signal before outputting the NEFLT signal.

The high state of NEFLT signal propagates to the SDRCLK signal 816 after a Delay period 830 caused by the analog delay 808.

The high state of SDRCLK signal 816 resets the set-reset latch 806 output, NEFLT signal, to low after tdRST. The high state of SDRCLK signal 816 also enables the level latch 810 for the SI signal value to be output to S signal.

The comparator 804 detects that the S signal (symbol S1 832) matches the symbol S1 824 of the SI signal, and turns its output, the NE signal, to low.

The low state of NEFLT signal propagates to SDRCLK signal 816 after a Delay period 834 caused by the analog delay 808.

The falling (trailing) edge 836 of the SDRCLK signal 816 causes DDRCLK signal to toggle 838 after propagation delay of its clock tree network.

When a new symbol value S2 is being received, it causes the SI signal to start changing its value to the next symbol S2 840 after tHD from the last falling (trailing) edge of SDRCLK signal.

The timing constraint for the symbol cycle period $t_{SYM}$ may be as follows:

$$t_{dNE}+\text{Delay}\times 2+t_{dRST}+t_{HD}<t_{SYM}.$$

More specifically, the symbol cycle time $t_{SYM}$ must be greater than total of: two Delay periods, tHD, tdNE, and tdRST. If the total of these four time periods exceeds the $t_{SYM}$ period, the trailing edge of SDRCLK overlaps the next symbol cycle, disabling the NEFLT signal from being set for the overlapping period. Note that the amount of overlapping accumulates from cycle to cycle and eventually result in a loss (skip) of a whole symbol.

The timing constraint for the setup time tSU may be as follows:

$$t_{dNE}+\text{Delay}>t_{SU}.$$

More specifically, the setup time $t_{SU}$ must be greater than total of: one Delay period and tdNE. Failing to satisfy this condition causes the level latch 810 to propagate an invalid intermediate state of the SI input signal to the S signal.

Figure 15:
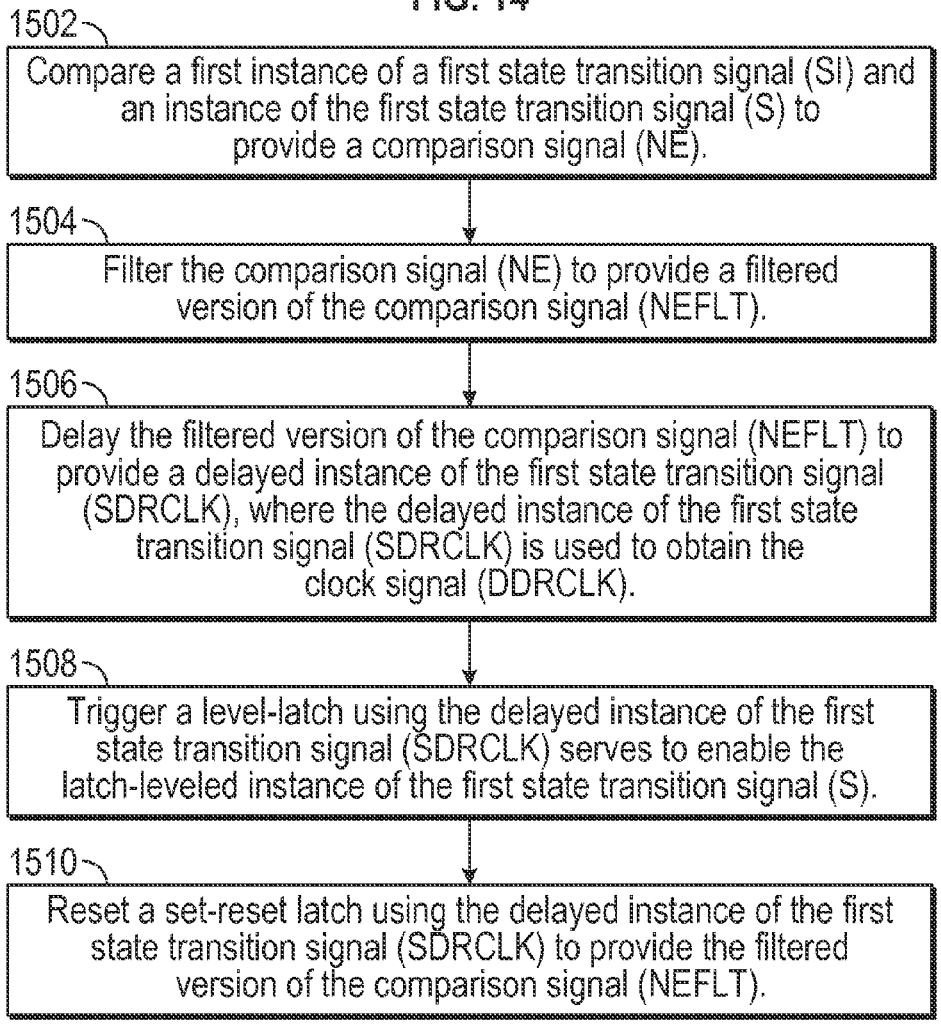
FIG. 15 illustrates a first method for extracting a clock signal.

FIG. 15 illustrates a first method for extracting a clock signal. In one example, this method may be implemented by the circuit illustrated in FIG. 8. A first instance of the first state transition signal (SI) is compared to a level-latched instance of the first state transition signal (S) to provide a comparison signal (NE) 1502. The comparison signal (NE) is filtered to provide a filtered version of the comparison signal (NEFLT) 1504. The filtered version of the comparison signal (NEFLT) is delayed to provide a delayed instance of the first state transition signal (SDRCLK), where the delayed instance of the first state transition signal (SDRCLK) is used to obtain the clock signal (DDRCLK) 1506. The delayed instance of the first state transition signal (SDRCLK) serves to trigger a level-latch that enables the latch-leveled instance of the first state transition signal (S) 1508. The delayed instance of the first state transition signal (SDRCLK) also serves to reset a set-reset latch that provides the filtered version of the comparison signal (NEFLT) 1510.

Second Exemplary Multi-Wire Transmission System with Scalable Clock Extraction

Figure 9:
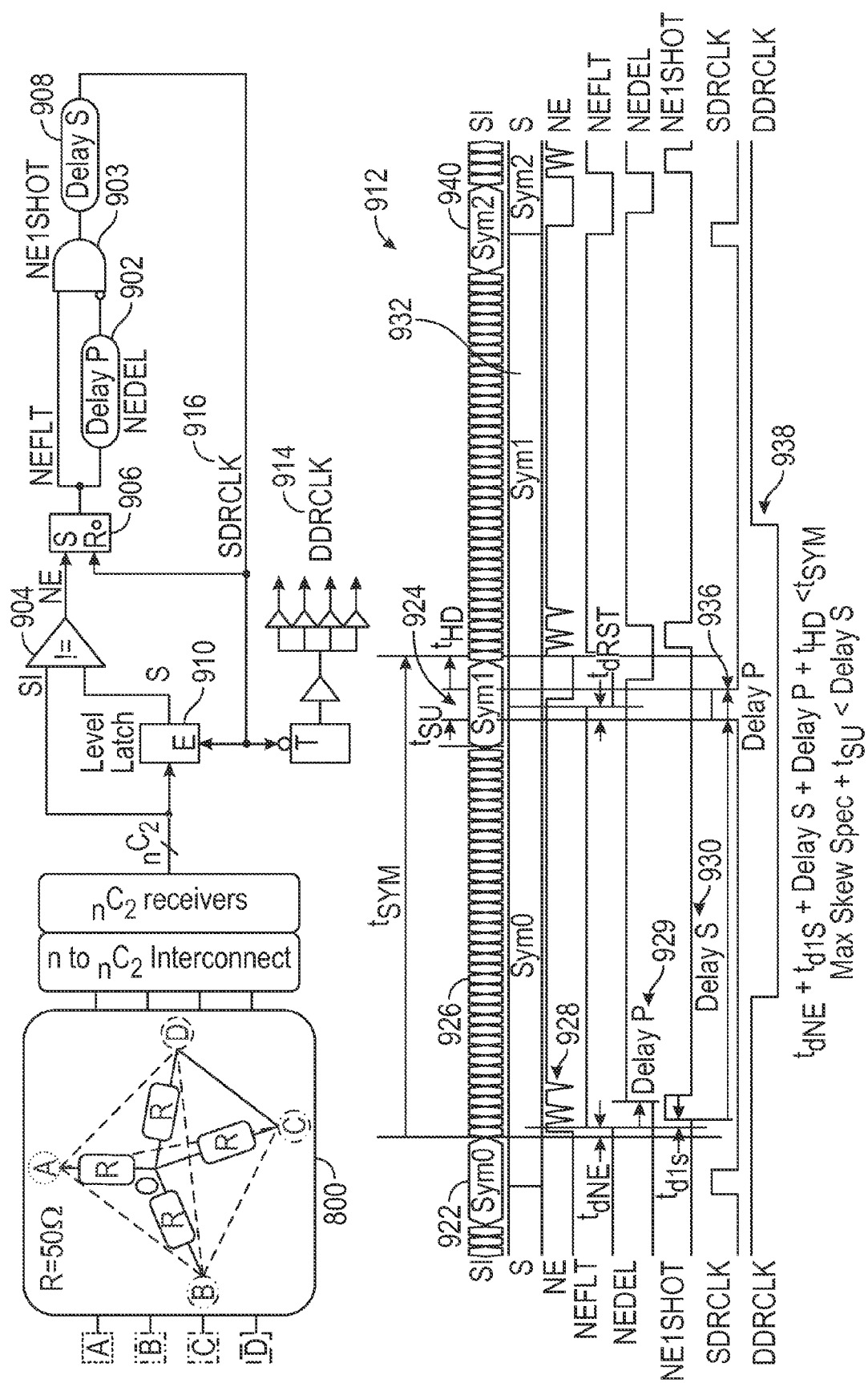
FIG. 9 illustrates a clock and data transmission scheme for a 4-wire differential signaling system with embedded clock information.

FIG. 9 illustrates a clock and data transmission scheme for a 4-wire system with embedded clock information. This CDR circuit is similar to that of FIG. 8 but an additional analog delay 902 has been introduced along with a one-shot logic 902/903.

This clock extraction circuit includes a comparator 904, a set-reset latch 906, a first analog delay device 902, a one-shot logic 902/903, a second analog delay device 908, and a level latch 910. The comparator 904 may compare a first instance of the first state transition signal (SI) and a level-latched instance of the first state transition signal (S) and outputs a comparison signal (NE). The set-reset latch 906 may receive the comparison signal (NE) from the comparator 904 and outputs a filtered version of the comparison signal (NEFLT). The first analog delay device 902 may receive the filtered version of the comparison signal (NEFLT) and outputs a delayed instance of the filtered version of the comparison signal (NEDEL). The one-shot logic 902/903 may receive the filtered comparison signal (NEFLT) and the delayed instance of the filtered version of the comparison signal (NEDEL) and outputs a second filtered version of the comparison signal (NE1SHOT). The second analog delay device 908 may receive the second filtered version of the comparison signal (NE1SHOT) and outputs a delayed instance of the first state transition signal (SDRCLK), where the delayed instance of the first state transition signal (SDRCLK) is used to generate the clock signal (DDRCLK). The set-reset latch 906 may be reset based on the delayed instance of the first state transition signal (SDRCLK). The level latch 910 may receive the first state transition signal (SI) and outputs the level-latched instance of the first state transition signal (S), where the level latch 910 is triggered based on the delayed instance of the first state transition signal (SDRCLK).

As can be appreciated from the timing diagram 912, the small delay period 929 introduced by the first analog delay device 902 provides more margins for setup time between symbols.

The following definitions are used in the timing diagram 912 signal:

$t_{sym}$: one symbol cycle period,
$t_{SU}$: setup time of SI for the level latches 910 referenced to the rising (leading) edge of SDRCLK 916,
$t_{HD}$: hold time of SI for the level latches 910 referenced to the falling (trailing) edge of SDRCLK 916,
$t_{dNE}$: propagation delay of the comparator 904,
$t_{dRST}$: reset time of the set-reset latch 906 from the rising (leading) edge of SDRCLK 916,
$t_{d1S}$: propagation delay of the one-shot logic 903.

Initially, signals SI and S hold the previous symbol value Sym0 922. Signals NE, NEFLT, and SDRCLK are zero. The DDRCLK 914 is stable but can be either high or low.

When a new symbol value Sym1 924 is being received, it causes signal SI to start changing its value. The SI value may be different from Sym1 924 (valid data) due to the possibility of receiving intermediate or indeterminate states 926 of the signal transition (from Sym0 to Sym1) that may be caused, for example, by inter-wire skew, over/undershoot, cross-talk, etc.

The NE signal becomes high as soon as the comparator 904 detects different value between SI and S, and that asynchronously sets the set-reset latch 906 output, NEFLT signal, high after tdNE, which hold its high state until it is reset by a high state of SDRCLK 916 which will arrive approximately a Delay period S (caused by analog delay 908) after rising of NEFLT signal.

The intermediate states at SI (invalid data) may contain a short period of symbol value Sym0 922 causing the comparator 904 output NE signal to turn back low for short period (spikes 928 in the NE signal). The low state of the NE signal will not affect the set-reset latch 906 output, NEFLT signal, since the set-reset latch 906 effectively filters out spikes on the NE signal before outputting the NEFLT signal.

The one-shot circuit (logic gate 903 with analog delay P 902) generates high state on its output, NE1SHOT signal, after td1S from rising edge of NEFLT signal, and holds the NE1SHOT signal at a high state for the Delay P period 929 before turns it to a low state.

The high state of NE1SHOT signal propagates to the SDRCLK signal 916 after a Delay S period 930 caused by the analog delay S 908.

The high state of SDRCLK signal 916 resets the set-reset latch 906 output, NEFLT signal, to low after tdRST. The high state of SDRCLK signal 916 also enables the level latch 910 for the SI signal value to be output to S signal.

The comparator 904 detects when the S signal (symbol Sym1 932) and matches the symbol Sym1 924 of the SI signal, and turns its output, the NE signal, to low.

The low state of NE1SHOT signal propagates to the SDRCLK signal 916 after a Delay period S 930 caused by the analog delay S 908.

The falling (trailing) edge 936 of the SDRCLK signal 916 causes DDRCLK signal to toggle 938 after propagation delay of its clock tree network.

When a new symbol value Sym2 is being received, it causes the SI signal to start changing its value to the next symbol Sym2 940 after tHD from the last falling (trailing) edge 936 of SDRCLK signal.

The timing constraint for the symbol cycle period $t_{SYM}$ may be as follows:

$$t_{dNE}+t_{d1S}+\text{Delay } S+\text{Delay } P+t_{HD}<t_{SYM}.$$

More specifically, the symbol cycle time $t_{SYM}$ must be greater than total of: a Delay period S, a Delay Period P, $t_{HD}$, $t_{dNE}$, $t_{d1S}$ and $t_{dRST}$. If the total of these six time periods exceeds the $t_{SYM}$ period, the trailing edge of SDRCLK overlaps the next symbol cycle, disabling the NEFLT signal from being set for the overlapping period. Note that the amount of overlapping period accumulates cycle by cycle and eventually results in an extra SDRCLK pulse in one symbol cycle.

The timing constraint for the setup time $t_{SU}$ may be as follows:

$$\text{Max. skew spec}+t_{SU}<\text{Delay } S.$$

More specifically, the delay period S must be less than the setup time $t_{SU}$ plus the maximum skew.

Figure 10:
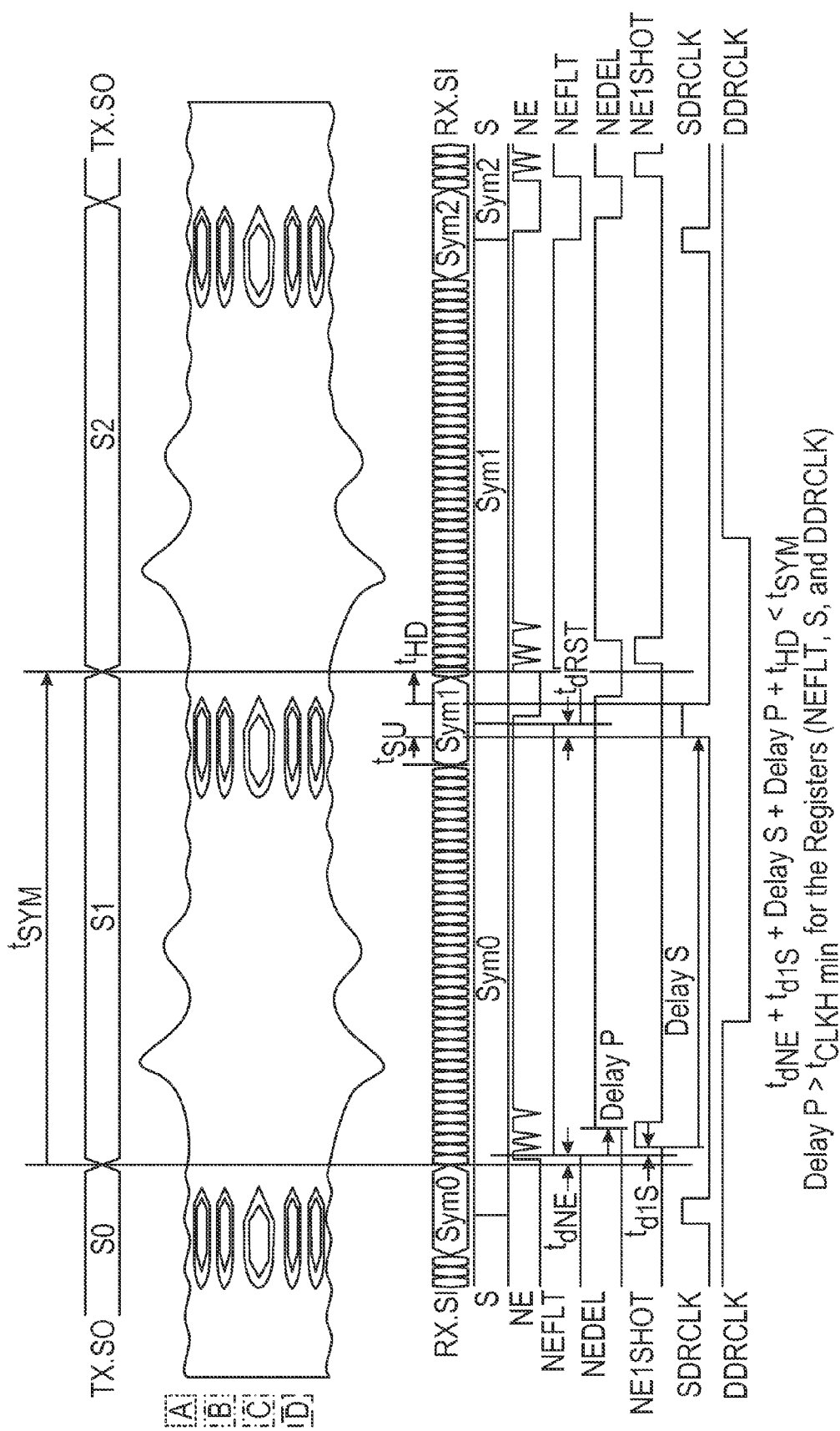
FIG. 10 is a timing diagram for the signals in the CDR circuit in FIG. 9.

FIG. 10 is a timing diagram for the signals in the CDR circuit in FIG. 9. The signal NE and then signal NEFLT are set as soon as the circuit detects the received data signal SI change from previously latched received data S regardless of the signal value, thereby detecting the start of any signal transition. An unstable received data state SI is masked for the analog delay S 908 period, making the NEFLT signal immune to glitches in the SI signal from any intermediate state transitions (between symbol transitions). This system can sample the correct data from small time periods as long as the High period of SDRCLK (=Delay P) is sufficiently long.

Figure 11:
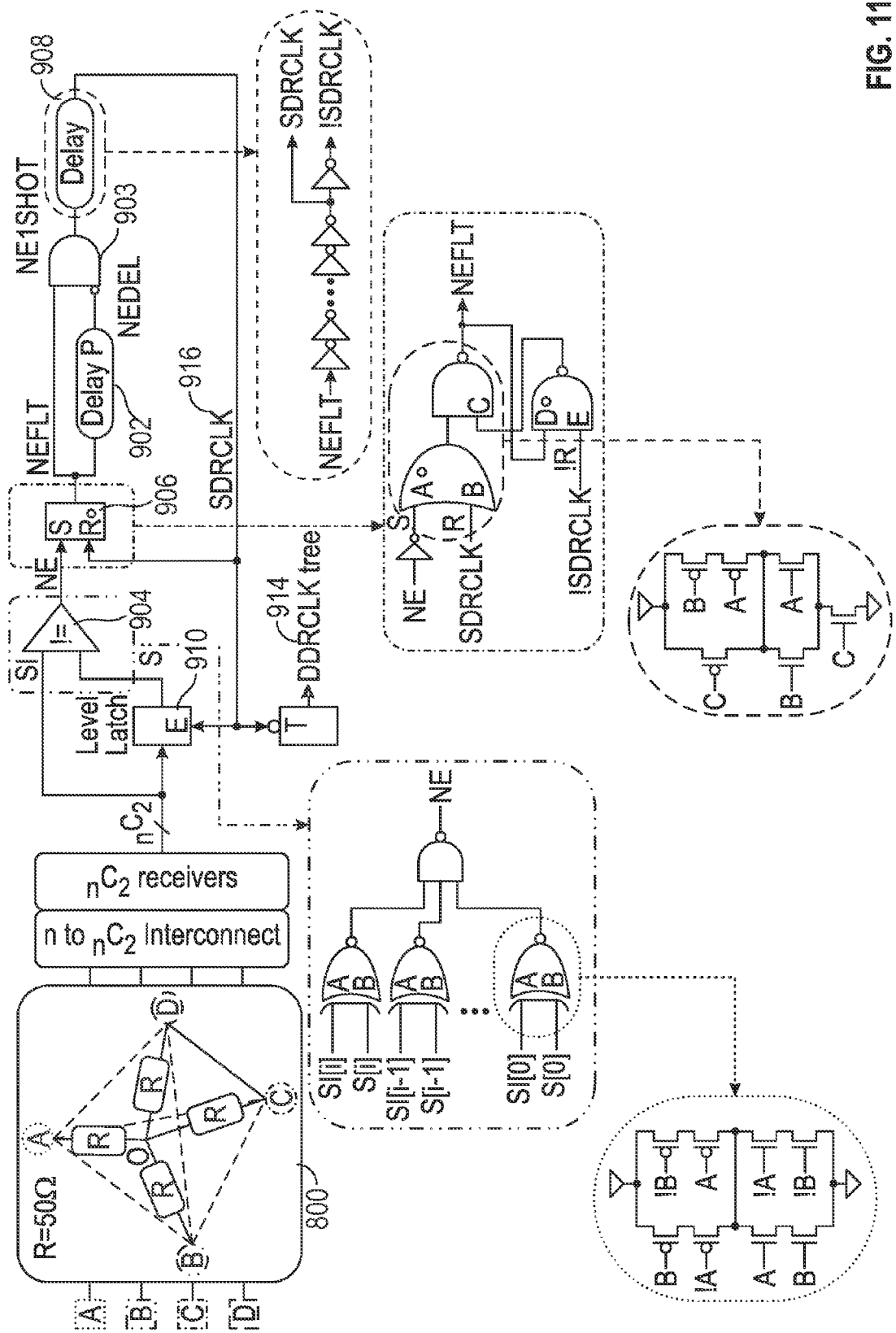
FIG. 11 illustrates exemplary implementations of various circuit components for the CDR circuit of FIG. 9.

FIG. 11 illustrates exemplary implementations of various circuits components for the CDR circuit of FIG. 9.

Figure 16:
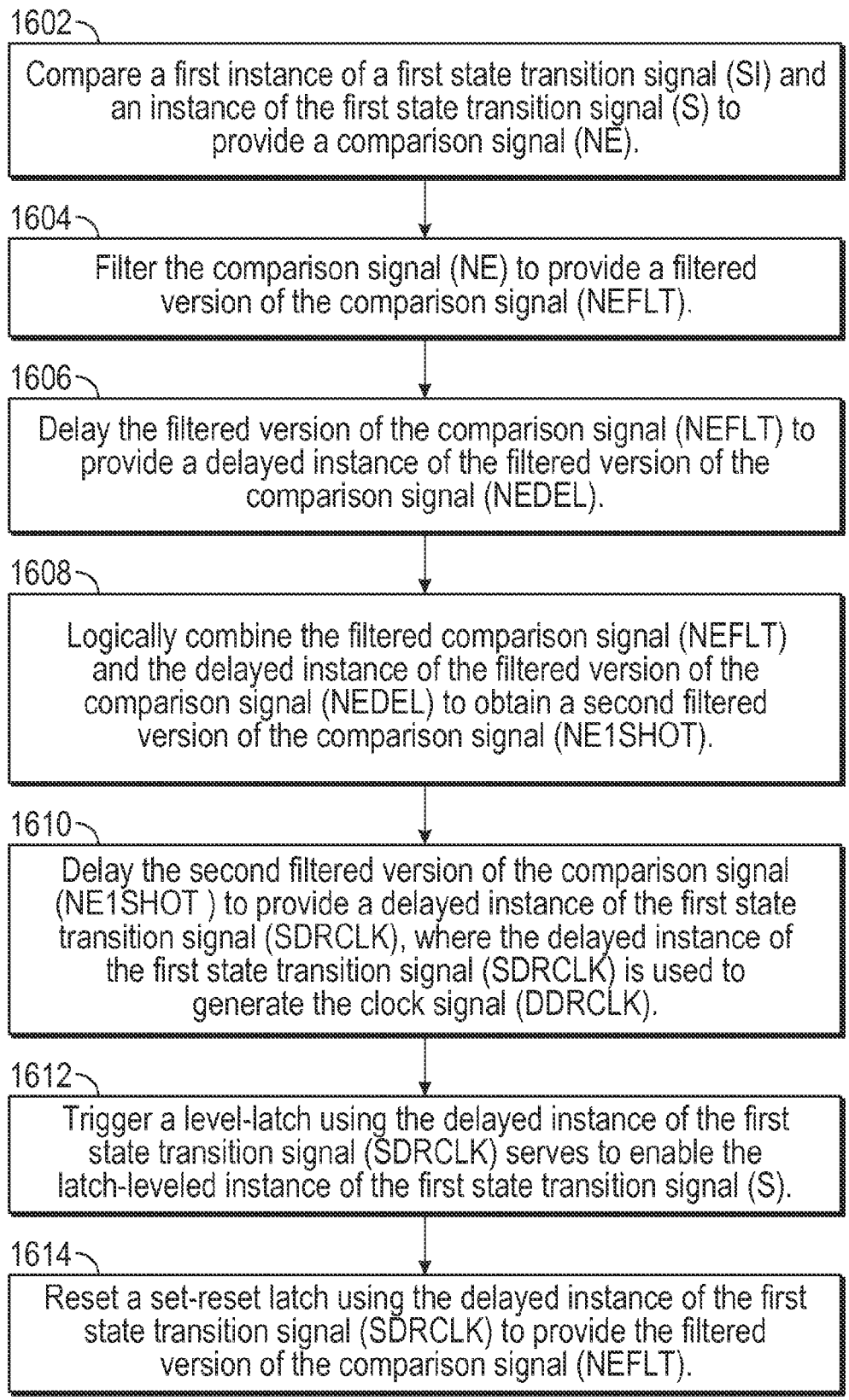
FIG. 16 illustrates a second method for extracting a clock signal.

FIG. 16 illustrates a second method for extracting a clock signal. In one example, this method may be implemented by the circuit illustrated in FIGS. 9, 10 and 11. A first instance of the first state transition signal (SI) is compared to an instance of the first state transition signal (S) to provide a comparison signal (NE) 1602. The comparison signal (NE) is filtered to provide a filtered version of the comparison signal (NEFLT) 1604. The filtered version of the comparison signal (NEFLT) is delayed to provide a delayed instance of the filtered version of the comparison signal (NEDEL) 1606. The filtered comparison signal (NEFLT) and the delayed instance of the filtered version of the comparison signal (NEDEL) are logically combine to obtain a second filtered version of the comparison signal (NE1SHOT) 1608. The second filtered version of the comparison signal (NE1SHOT) is delayed to provide a delayed instance of the first state transition signal (SDRCLK), where the delayed instance of the first state transition signal (SDRCLK) is used to generate the clock signal (DDRCLK) 1610. The delayed instance of the first state transition signal (SDRCLK) serves to trigger a level-latch that enables the latch-leveled instance of the first state transition signal (S) 1612. The delayed instance of the first state transition signal (SDRCLK) also serves to reset a set-reset latch that provides the filtered version of the comparison signal (NEFLT) 1614.

Third Exemplary Multi-Wire Transmission System with Scalable Clock Extraction

Figure 12:
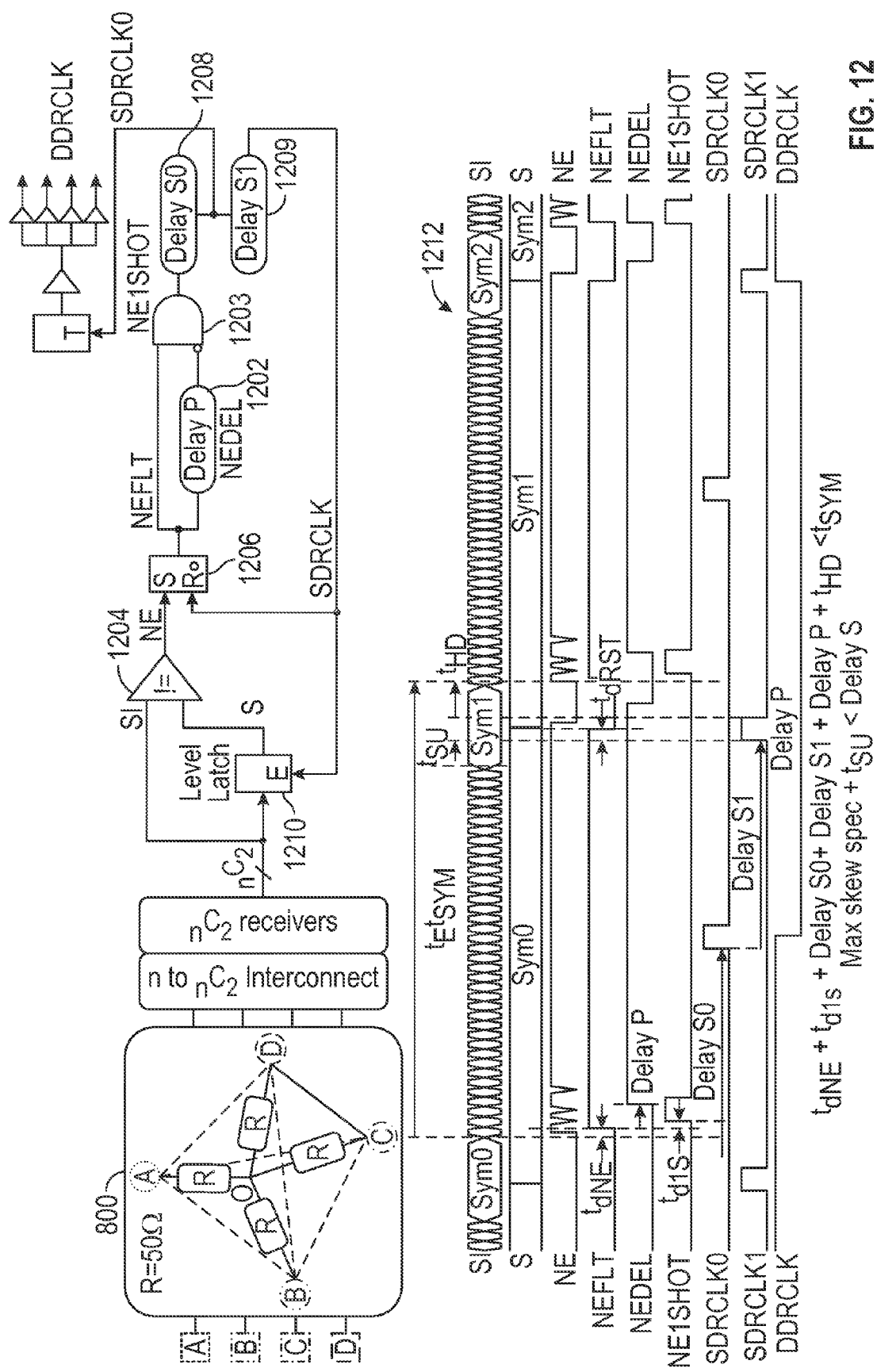
FIG. 12 illustrates another data transmission scheme for a 4-wire system with embedded clock information.

FIG. 12 illustrates another data transmission scheme for a 4-wire system with embedded clock information. This clock recovery circuit is similar to that of FIG. 9 but an additional analog delay 1209 has been introduced.

This clock extraction circuit includes a comparator 1204, a set-reset latch 1206, a first analog delay device 1202, a one-shot logic 1202/1203, a second analog delay device 1208, a third analog delay device 1209, and a level latch 1210. The comparator 1204 may compare a first instance of the first state transition signal (SI) and a level-latched instance of the first state transition signal (S) and outputs a comparison signal (NE). The set-reset latch 1206 may receive the comparison signal (NE) from the comparator and outputs a filtered version of the comparison signal (NEFLT). The first analog delay device 1202 may receive the filtered version of the comparison signal (NEFLT) and outputs a delayed instance of the filtered version of the comparison signal (NEDEL). The one-shot logic 1202/1203 may receive the filtered comparison signal (NEFLT) and the delayed instance of the filtered version of the comparison signal (NEDEL) and outputs a second filtered version of the comparison signal (NE1SHOT). The second analog delay device 1208 may receive the second filtered version of the comparison signal (NE1SHOT) and outputs a first delayed instance of the first state transition signal (SDRCLK0), where the first delayed instance of the first state transition signal (SDRCLK0) is used to generate the clock signal (DDRCLK). The third analog delay device S1 1209 may receive the first delayed instance of the first state transition signal (SDRCLK0) and outputs a second delayed instance of the first state transition signal (SDRCKL). The set-reset latch 1206 may be reset based on the second delayed instance of the first state transition signal.

The level latch 1210 may receive the first state transition signal (SI) and outputs the level-latched instance of the first state transition signal (S), where the level latch 1210 is triggered based on the second delayed instance of the first state transition signal (SDRCLK).

The timing diagram 1212 is very similar to the timing diagram 912 (FIG. 9), but the delay S 1208 has been replaced by two equivalent delays S0 1208 and S1 1209. This approach causes the DDRCLK to toggle earlier in FIG. 12 than in FIG. 9.

The timing constraint for the symbol cycle period $t_{SYM}$ may be as follows:

$$t_{dNE}+t_{d1S}+\text{Delay } S0+\text{Delay } S1+\text{Delay } P+t_{HD}<t_{SYM}.$$

More specifically, the symbol cycle time $t_{SYM}$ must be greater than total of: a Delay period S0, a Delay period S1, a Delay Period P, $t_{dNE}$, $t_{d1S}$, and $t_{HD}$. If the total of these six time periods exceeds the $t_{SYM}$ period, the trailing edge of SDRCLK overlaps the next symbol cycle, disabling the NEFLT signal from being set for the overlapping period. Note that the amount of overlapping period accumulates cycle by cycle and eventually results in an extra SDRCLK pulse in one symbol cycle.

The timing constraint for the delay P may be as follows:

$$\text{Max skew spec}+t_{SU}<\text{Delay } S.$$

More specifically, the delay period S must greater than the total of: $t_{SU}$ plus the maximum skew. Failing to satisfy this condition causes the level latch 810 to propagate an invalid intermediate state of the SI input signal to the S signal.

Figure 17:
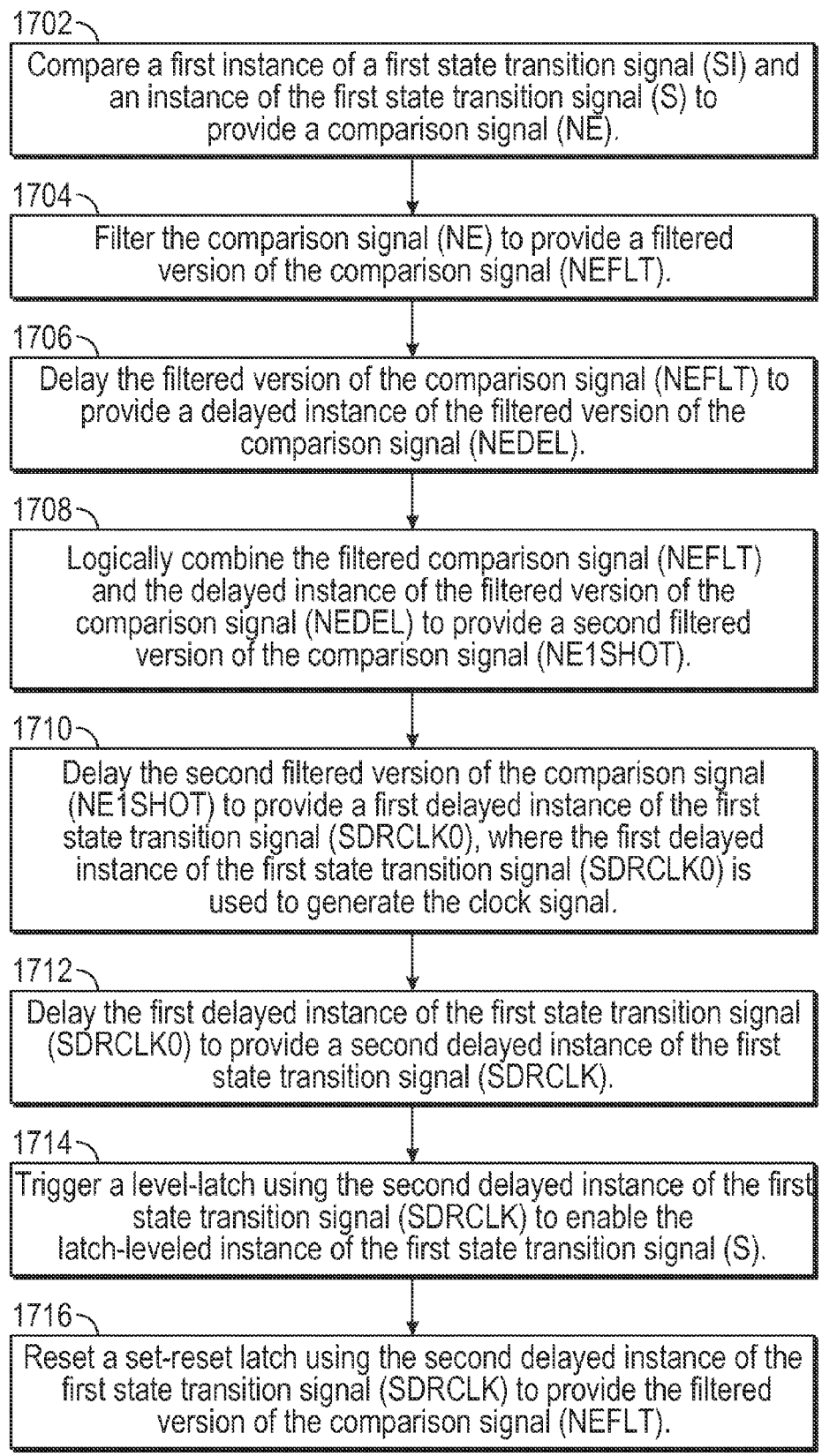
FIG. 17 illustrates a third method for extracting a clock signal.

FIG. 17 illustrates a third method for extracting a clock signal. In one example, this method may be implemented by the circuit illustrated in FIG. 12. A first instance of the first state transition signal (SI) is compared to a level-latched instance of the first state transition signal (S) to provide a comparison signal (NE) 1702. The comparison signal (NE) is filtered to provide a filtered version of the comparison signal (NEFLT) 1704. The filtered version of the comparison signal (NEFLT) is delayed to provide a delayed instance of the filtered version of the comparison signal (NEDEL) 1706. The filtered comparison signal (NEFLT) and the delayed instance of the filtered version of the comparison signal (NEDEL) are logically combined to provide a second filtered version of the comparison signal (NE1SHOT) 1708. The second filtered version of the comparison signal (NE1SHOT) is delayed to provide a first delayed instance of the first state transition signal (SDRCLK0), where the first delayed instance of the first state transition signal (SDRCLK0) is used to generate the clock signal (DDRCLK) 1710. The first delayed instance of the first state transition signal (SDRCLK0) may be further delayed (delay S1 1209 in FIG. 12) to obtain a second delayed instance of the first state transition signal (SDRCLK) 1712. The second delayed instance of the first state transition signal (SDRCLK) serves to trigger a level-latch that enables the latch-leveled instance of the first state transition signal (S) 1714. The second delayed instance of the first state transition signal (SDRCLK) also serves to reset a set-reset latch that provides the filtered version of the comparison signal (NEFLT) 1716.

Fourth Exemplary Multi-Wire Transmission System with Scalable Clock Extraction

Figure 13:
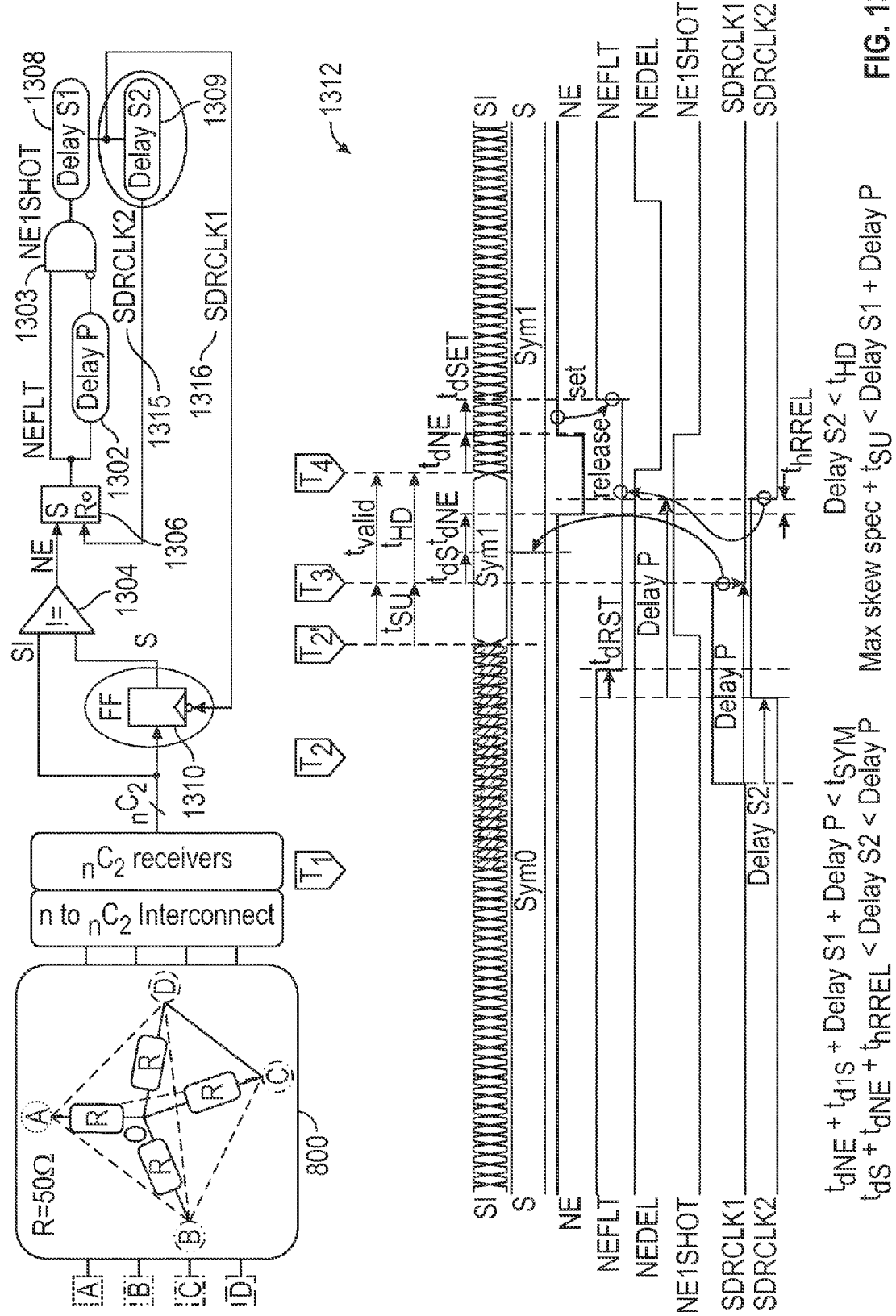
FIG. 13 illustrates yet another data transmission scheme for a 4-wire system with embedded clock information.

FIG. 13 illustrates yet another data transmission scheme for a 4-wire system with embedded clock information. This clock recovery circuit is similar to that of FIG. 12 but a flip flop 1310 instead of the level latch 1210 (FIG. 12). This clock extraction circuit includes a comparator 1304, a set-reset latch 1306, a first analog delay device 1302, a one-shot logic 1302/1303, a second analog delay device 1308, a third analog delay device 1309, and a flip flop 1310. The comparator 1304 may compare a first instance of the first state transition signal (SI) and a latched instance of the first state transition signal (S) and outputs a comparison signal (NE). The set-reset latch 1306 may receive the comparison signal (NE) from the comparator and outputs a filtered version of the comparison signal (NEFLT). The first analog delay device 1302 may receive the filtered version of the comparison signal (NEFLT) and outputs a delayed instance of the filtered version of the comparison signal (NEDEL). The one-shot logic 1302/1303 may receive the filtered comparison signal (NEFLT) and the delayed instance of the filtered version of the comparison signal (NEDEL) and outputs a second filtered version of the comparison signal (NE1SHOT). The second analog delay device S1 1308 may receive the second filtered version of the comparison signal (NE1SHOT) and outputs a first delayed instance of the first state transition signal (SDRCLK1), where the first delayed instance of the first state transition signal (SDRCLK1) is used to generate the clock signal (DDRCLK). The third analog delay device S2 1309 may receive the first delayed instance of the first state transition signal (SDRCLK1) and outputs a second delayed instance of the first state transition signal (SDRCKL2) 1315. The set-reset latch 1306 may be reset based on the second delayed instance of the first state transition signal (SDRCKL2) 1315.

The flip flop 1310 may receive the first state transition signal (SI) and outputs the latched instance of the first state transition signal (S), where the flip flop 1310 is triggered based on the first delayed instance of the first state transition signal (SDRCLK1) 1316.

The timing diagram 1312 is very similar to the timing diagram 1212 (FIG. 12).

The timing constraint for the symbol cycle period $t_{SYM}$ may be as follows:

$$t_{dNE}+t_{d1S}+\text{Delay } S1+\text{Delay } P<t_{SYM}.$$

More specifically, the symbol cycle time $t_{SYM}$ must be greater than total of: a Delay period S1, a Delay period P, $t_{dNE}$, and $t_{d1S}$. If the total of these four time periods exceeds the $t_{SYM}$ period, the trailing edge of SDRCLK1 overlaps the next symbol cycle, disabling the NEFLT signal from being set for the overlapping period. Note that the amount of overlapping period accumulates cycle by cycle and eventually results in an extra SDRCLK pulse in one symbol cycle.

The timing constraint for the delay P may be as follows:

$$t_{dS}+t_{dNE}+t_{hRREL}<\text{Delay } S2<\text{Delay } P.$$

More specifically, the delay period P must greater than delay period S2, which must be greater that the total of: $t_{dS}+t_{dNE}+t_{hRREL}$.

The timing constraint for the $t_{HD}$ may be as follows:

$$\text{Delay } S2 \leq t_{HD}.$$

The timing constraint for the delay P and delay S1 may be as follows:

$$\text{Max skew spec}+t_{SU}<\text{Delay } S1+\text{Delay } P.$$

Figure 18:
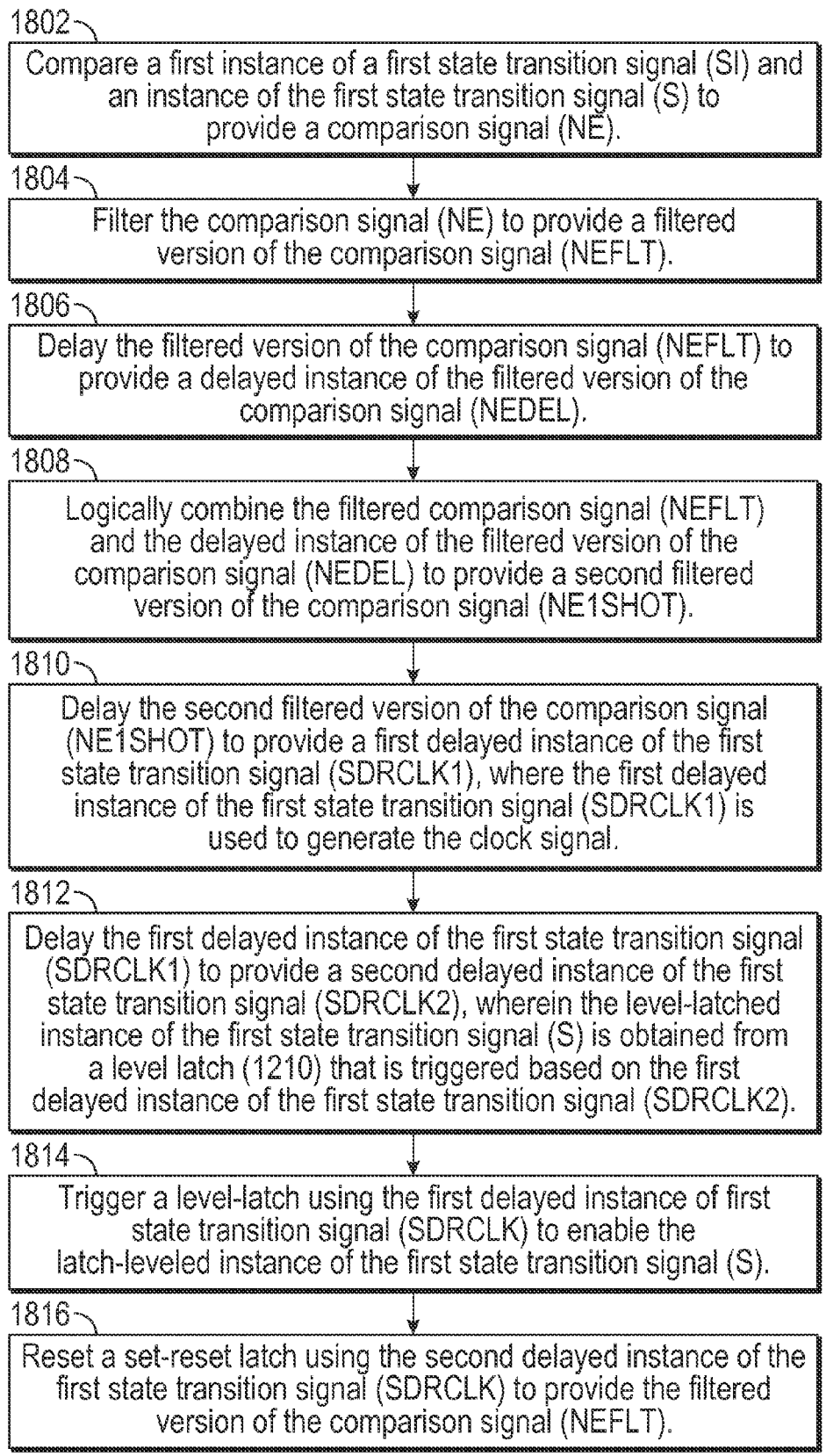
FIG. 18 illustrates a fourth method for extracting a clock signal.

FIG. 18 illustrates a fourth method for extracting a clock signal. In one example, this method may be implemented by the circuit illustrated in FIG. 13. A first instance of the first state transition signal (SI) may be compared to a level-latched instance of the first state transition signal (S) to provide a comparison signal (NE) 1802. The comparison signal (NE) may be filtered to provide a filtered version of the comparison signal (NEFLT) 1804. The filtered version of the comparison signal (NEFLT) may be delayed to provide a delayed instance of the filtered version of the comparison signal (NEDEL) 1806. The filtered comparison signal (NEFLT) and the delayed instance of the filtered version of the comparison signal (NEDEL) may be logically combined to provide a second filtered version of the comparison signal (NE1SHOT) 1808. The second filtered version of the comparison signal (NE1SHOT) may be delayed to provide a first delayed instance of the first state transition signal (SDRCLK1), where the first delayed instance of the first state transition signal (SDRCLK1) is used to generate the clock signal 1810. The first delayed instance of the first state transition signal (SDRCLK1) may be delayed to provide a second delayed instance of the first state transition signal (SDRCLK2), wherein the level-latched instance of the first state transition signal (S) is obtained from a level latch (1210) that is triggered based on the first delayed instance of the first state transition signal (SDRCLK2) 1812. The first delayed instance of the first state transition signal (SDRCLK1) serves to trigger a flip flop that enables the latch-leveled instance of the first state transition signal (S) 1814. The second delayed instance of the first state transition signal (SDRCLK2) serves to reset a set-reset latch that provides the filtered version of the comparison signal (NEFLT) 1816.

One or more of the components, steps, features and/or functions illustrated in the Figures may be rearranged and/or combined into a single component, step, feature or function or embodied in several components, steps, or functions. Additional elements, components, steps, and/or functions may also be added without departing from novel features disclosed herein. The apparatus, devices, and/or components illustrated in the Figures may be configured to perform one or more of the methods, features, or steps described in the Figures. The novel algorithms described herein may also be efficiently implemented in software and/or embedded in hardware.

Also, it is noted that the embodiments may be described as a process that is depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed. A process may correspond to a method, a function, a procedure, a subroutine, a subprogram, etc. When a process corresponds to a function, its termination corresponds to a return of the function to the calling function or the main function.

Moreover, a storage medium may represent one or more devices for storing data, including read-only memory (ROM), random access memory (RAM), magnetic disk storage mediums, optical storage mediums, flash memory devices and/or other machine readable mediums for storing information. The term "machine readable medium" includes, but is not limited to portable or fixed storage devices, optical storage devices, wireless channels and various other mediums capable of storing, containing or carrying instruction(s) and/or data.

Furthermore, embodiments may be implemented by hardware, software, firmware, middleware, microcode, or any combination thereof. When implemented in software, firmware, middleware or microcode, the program code or code segments to perform the necessary tasks may be stored in a machine-readable medium such as a storage medium or other storage(s). A processor may perform the necessary tasks. A code segment may represent a procedure, a function, a subprogram, a program, a routine, a subroutine, a module, a software package, a class, or any combination of instructions, data structures, or program statements. A code segment may be coupled to another code segment or a hardware circuit by passing and/or receiving information, data, arguments, parameters, or memory contents. Information, arguments, parameters, data, etc. may be passed, forwarded, or transmitted via any suitable means including memory sharing, message passing, token passing, network transmission, etc.

The various illustrative logical blocks, modules, circuits, elements, and/or components described in connection with the examples disclosed herein may be implemented or performed with a general purpose processor, a digital signal processor (DSP), an application specific integrated circuit (ASIC), a field programmable gate array (FPGA) or other programmable logic component, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing components, e.g., a combination of a DSP and a microprocessor, a number of microprocessors, one or more microprocessors in conjunction with a DSP core, or any other such configuration.

The methods or algorithms described in connection with the examples disclosed herein may be embodied directly in hardware, in a software module executable by a processor, or in a combination of both, in the form of processing unit, programming instructions, or other directions, and may be contained in a single device or distributed across multiple devices. A software module may reside in RAM, flash memory, ROM, erasable programmable read-only memory (EPROM), electrically erasable programmable read-only memory (EEPROM), registers, hard disk, a removable disk, a Compact Disc Read-Only Memory (CD-ROM), or any other form of storage medium known in the art. A storage medium may be coupled to the processor such that the processor can read information from, and write information to, the storage medium. In the alternative, the storage medium may be integral to the processor.

Those of skill in the art would further appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system.

The various features of the invention described herein can be implemented in different systems without departing from the invention. It should be noted that the foregoing embodiments are merely examples and are not to be construed as limiting the invention. The description of the embodiments is intended to be illustrative, and not to limit the scope of the claims. As such, the present teachings can be readily applied to other types of apparatuses and many alternatives, modifications, and variations will be apparent to those skilled in the art.

What is claimed is:

1. A clock recovery circuit, comprising:
a receiver circuit adapted to decode data symbols from signals transmitted on a plurality of data lines, where at least one data symbol is encoded in state transitions of the signals transmitted on the plurality of data lines; and
a clock extraction circuit that obtains a clock signal from state transition signals derived from the state transitions while compensating for skew in different ones of the plurality of data lines, and masking data state transition glitches, wherein the clock extraction circuit uses a feedback delayed instance of a first state transition signal (SDRCLK) to obtain the clock signal.

2. The clock recovery circuit of claim 1, wherein the plurality of data lines is three or more lines.

3. The clock recovery circuit of claim 1, wherein the clock extraction circuit includes
a comparator (804) that compares a first instance of the first state transition signal (SI) and a level-latched instance of the first state transition signal (S) and outputs a comparison signal (NE);
a set-reset latch (806) that receives the comparison signal (NE) from the comparator (804) and outputs a filtered version of the comparison signal (NEFLT); and
an analog delay device (808) that receives the filtered version of the comparison signal (NEFLT) and outputs the feedback delayed instance of the first state transition signal (SDRCLK), where the feedback delayed instance of the first state transition signal (SDRCLK) is used to obtain the clock signal (DDRCLK).

4. The clock recovery circuit of claim 3, wherein the set-reset latch (810) is reset based on the feedback delayed instance of the first state transition signal (SDRCLK).

5. The clock recovery circuit of claim 3, wherein the clock extraction circuit further includes:
a level latch (810) that receives the first state transition signal (SI) and outputs the level-latched instance of the first state transition signal (S), where the level latch (810) is triggered based on the feedback delayed instance of the first state transition signal (SDRCLK).

6. The clock recovery circuit of claim 1, wherein the clock extraction circuit includes
   a comparator (904) that compares a first instance of the first state transition signal (SI) and a level-latched instance of the first state transition signal (S) and outputs a comparison signal (NE);
   a set-reset latch (906) that receives the comparison signal (NE) from the comparator (904) and outputs a filtered version of the comparison signal (NEFLT);
   a first analog delay device (902) that receives the filtered version of the comparison signal (NEFLT) and outputs a delayed instance of the filtered version of the comparison signal (NEDEL);
   one-shot logic (902/903) that receives the filtered version of the comparison signal (NEFLT) and the delayed instance of the filtered version of the comparison signal (NEDEL) and outputs a second filtered version of the comparison signal (NE1SHOT); and
   a second analog delay device (908) that receives the second filtered version of the comparison signal (NE1SHOT) and outputs a feedback delayed instance of the first state transition signal (SDRCLK), where the feedback delayed instance of the first state transition signal (SDRCLK) is used to obtain the clock signal (DDRCLK).

7. The clock recovery circuit of claim 6, wherein the set-reset latch (906) is reset based on the feedback delayed instance of the first state transition signal (SDRCLK).

8. The clock recovery circuit of claim 6, wherein the clock extraction circuit further includes:
   a level latch (910) that receives the first state transition signal (SI) and outputs the level-latched instance of the first state transition signal (S), where the level latch (910) is triggered based on the feedback delayed instance of the first state transition signal (SDRCLK).

9. The clock recovery circuit of claim 1, wherein the clock extraction circuit includes
   a comparator (1204) that compares a first instance of the first state transition signal (SI) and a level-latched instance of the first state transition signal (S) and outputs a comparison signal (NE);
   a set-reset latch (1206) that receives the comparison signal (NE) from the comparator (1204) and outputs a filtered version of the comparison signal (NEFLT);
   a first analog delay device (1202) that receives the filtered version of the comparison signal (NEFLT) and outputs a delayed instance of the filtered version of the comparison signal (NEDEL);
   one-shot logic (1202/1203) that receives the filtered version of the comparison signal (NEFLT) and the delayed instance of the filtered version of the comparison signal (NEDEL) and outputs a second filtered version of the comparison signal (NE1SHOT);
   a second analog delay device (1208) that receives the second filtered version of the comparison signal (NE1SHOT) and outputs a first delayed instance of the first state transition signal (SDRCLK0), where the first delayed instance of the first state transition signal (SDRCLK0) is used to obtain the clock signal; and
   a third analog delay device (1209) that receives the first delayed instance of the first state transition signal (SDRCLK0) and outputs the feedback delayed instance of the first state transition signal (SDRCLK).

10. The clock recovery circuit of claim 9, wherein the set-reset latch (1206) is reset based on the feedback delayed instance of the first state transition signal (SDRCLK).

11. The clock recovery circuit of claim 9, wherein the clock extraction circuit further includes:
    a level latch (1210) that receives the first state transition signal (SI) and outputs the level-latched instance of the first state transition signal (S), where the level latch (1210) is triggered based on the feedback delayed instance of the first state transition signal (SDRCLK).

12. The clock recovery circuit of claim 1, wherein the clock extraction circuit includes
    a comparator (1304) that compares a first instance of the first state transition signal (SI) and a level-latched instance of the first state transition signal (S) and outputs a comparison signal (NE);
    a set-reset latch (1306) that receives the comparison signal (NE) from the comparator (1304) and outputs a filtered version of the comparison signal (NEFLT);
    a first analog delay device (1302) that receives the filtered version of the comparison signal (NEFLT) and outputs a delayed instance of the filtered version of the comparison signal (NEDEL);
    one-shot logic (1302/1303) that receives the filtered version of the comparison signal (NEFLT) and the delayed instance of the filtered version of the comparison signal (NEDEL) and outputs a second filtered version of the comparison signal (NE1SHOT);
    a second analog delay device (1308) that receives the second filtered version of the comparison signal (NE1SHOT) and outputs a first delayed instance of the first state transition signal (SDRCLK1), where the first delayed instance of the first state transition signal (SDRCLK1) is used to obtain the clock signal;
    a third analog delay device (1309) that receives the first delayed instance of the first state transition signal (SDRCLK1) and outputs a second delayed instance of the first state transition signal (SDRCLK2); and
    a flip flop (1310) that receives the first state transition signal (SI) and outputs the level-latched instance of the first state transition signal (S), where the level latch (1210) is triggered based on the first delayed instance of the first state transition signal (SDRCLK2).

13. The clock recovery circuit of claim 12, wherein the set-reset latch (1306) is reset based on the second delayed instance of the first state transition signal (SDRCLK2).

14. The clock recovery circuit of claim 1, wherein the signals transmitted on the plurality of data lines comprise a plurality of differentially encoded signals.

15. A method for recovering a clock signal, comprising:
    decoding data symbols from signals transmitted on a plurality of data lines, where at least one data symbol is encoded in state transitions of the signals transmitted on the plurality of data lines; and
    obtaining a clock signal from state transition signals derived from the state transitions while compensating for skew in different ones of the plurality of data lines, and masking data state transition glitches, wherein the clock signal is a feedback delayed instance of a first state transition signal (SDRCLK) that is used to obtain the clock signal.

16. The method of claim 15, wherein decoding the data symbols comprises:
    extracting data from the data symbols.

17. The method of claim 15, wherein the clock signal is obtained by:
    comparing a first instance of the first state transition signal (SI) and an instance of the first state transition signal (S) to provide a comparison signal (NE);

filtering the comparison signal (NE) to provide a filtered version of the comparison signal (NEFLT); and delaying the filtered version of the comparison signal (NEFLT) to provide the feedback delayed instance of the first state transition signal (SDRCLK), where the delayed instance of the first state transition signal (SDRCLK) is used to obtain the clock signal (DDRCLK).

18. The method of claim 15, wherein the clock signal is obtained by:
   comparing a first instance of the first state transition signal (SI) and a level-latched instance of the first state transition signal (S) to provide a comparison signal (NE);
   filtering the comparison signal (NE) to provide a filtered version of the comparison signal (NEFLT);
   delaying the filtered version of the comparison signal (NEFLT) to provide a delayed instance of the filtered version of the comparison signal (NEDEL);
   logically combining the filtered version of the comparison signal (NEFLT) and the delayed instance of the filtered version of the comparison signal (NEDEL) to obtain a second filtered version of the comparison signal (NE1SHOT); and
   delaying the second filtered version of the comparison signal (NE1SHOT) to provide the feedback delayed instance of the first state transition signal (SDRCLK), where the delayed instance of the first state transition signal (SDRCLK) is used to generate the clock signal (DDRCLK).

19. The method of claim 15, wherein the clock signal is obtained by:
   comparing a first instance of the first state transition signal (SI) and a level-latched instance of the first state transition signal (S) to provide a comparison signal (NE);
   filtering the comparison signal (NE) to provide a filtered version of the comparison signal (NEFLT);
   delaying the filtered version of the comparison signal (NEFLT) to provide a delayed instance of the filtered version of the comparison signal (NEDEL);
   logically combining the filtered version of the comparison signal (NEFLT) and the delayed instance of the filtered version of the comparison signal (NEDEL) to provide a second filtered version of the comparison signal (NE1SHOT);
   delaying the second filtered version of the comparison signal (NE1SHOT) to provide a first delayed instance of the first state transition signal (SDRCLK0), where the first delayed instance of the first state transition signal (SDRCLK0) is used to generate the clock signal; and
   delaying the first delayed instance of the first state transition signal (SDRCLK0) to provide the feedback delayed instance of the first state transition signal (SDRCLK).

20. The method of claim 15, wherein the clock signal is obtained by:
   comparing a first instance of the first state transition signal (SI) and a level-latched instance of the first state transition signal (S) to provide a comparison signal (NE);
   filtering the comparison signal (NE) to provide a filtered version of the comparison signal (NEFLT);
   delaying the filtered version of the comparison signal (NEFLT) to provide a delayed instance of the filtered version of the comparison signal (NEDEL);
   logically combining the filtered version of the comparison signal (NEFLT) and the delayed instance of the filtered version of the comparison signal (NEDEL) to provide a second filtered version of the comparison signal (NE1SHOT);
   delaying the second filtered version of the comparison signal (NE1SHOT) to provide a first delayed instance of the first state transition signal (SDRCLK1), where the first delayed instance of the first state transition signal (SDRCLK1) is used to generate the clock signal; and
   delaying the first delayed instance of the first state transition signal (SDRCLK1) to provide a second delayed instance of the first state transition signal (SDRCLK2),
   wherein the level-latched instance of the first state transition signal (S) is obtained from a level latch (1210) that is triggered based on the first delayed instance of the first state transition signal (SDRCLK2).

21. The method of claim 15, wherein the signals transmitted on the plurality of data lines comprise a plurality of differentially encoded signals.

22. A clock recovery circuit, comprising:
   means for decoding data symbols from signals transmitted on a plurality of data lines, where at least one data symbol is encoded in state transitions of the signals transmitted on the plurality of data lines; and
   means for obtaining a clock signal from state transition signals derived from the state transitions while compensating for skew in different ones of the plurality of data lines, and masking data state transition glitches, wherein the clock signal is a feedback delayed instance of a first state transition signal (SDRCLK) that is used to obtain the clock signal.

23. The clock recovery circuit of claim 22, wherein the means for decoding the data symbols is configured to:
   extract data from the data symbols.

24. The clock recovery circuit of claim 22, wherein the signals transmitted on the plurality of data lines comprises a plurality of differentially encoded signals.

* * * * *